(12) United States Patent
Cline et al.

(10) Patent No.: US 6,407,469 B1
(45) Date of Patent: Jun. 18, 2002

(54) CONTROLLER SYSTEM FOR POOL AND/OR SPA

(75) Inventors: David J. Cline, Newport Beach; Cindy Otto, Fountain Valley; Paul Rosenau, Santa Ana, all of CA (US)

(73) Assignee: Balboa Instruments, Inc., Tustin, CA (US)

( * ) Notice: Subject to any disclaimer, the term of this patent is extended or adjusted under 35 U.S.C. 154(b) by 0 days.

(21) Appl. No.: 09/451,561

(22) Filed: Nov. 30, 1999

(51) Int. Cl.[7] .................................................. H02J 1/00
(52) U.S. Cl. ............................ 307/11; 307/42; 307/147
(58) Field of Search ............................ 307/11, 147, 42, 307/116, 38, 39, 40; 361/1, 104, 752

(56) References Cited

U.S. PATENT DOCUMENTS

| | | | |
|---|---|---|---|
| 3,528,548 A | 9/1970 | Sheckler | 210/103 |
| 3,616,915 A | 11/1971 | Whitlock | 210/108 |
| 3,781,925 A | 1/1974 | Curtis et al. | 4/172.15 |
| 4,016,079 A | 4/1977 | Severin | 210/96 |
| 4,115,263 A | 9/1978 | James | 210/60 |
| 4,200,910 A | 4/1980 | Hall | 364/104 |
| 4,209,837 A | 6/1980 | Brown | 364/117 |
| 4,224,154 A | 9/1980 | Steininger | 210/85 |
| 4,233,694 A | 11/1980 | Janoskp et al. | 4/542 |
| 4,235,368 A | 11/1980 | Neel | 236/94 |
| 4,257,555 A | 3/1981 | Neel | 236/94 |
| 4,267,966 A | 5/1981 | Neel et al. | 236/46 A |
| 4,292,542 A | 9/1981 | Bajka | 307/28 |
| 4,298,946 A | 11/1981 | Hartsell et al. | 364/557 |
| 4,300,199 A | 11/1981 | Yoknis et al. | 364/557 |
| 4,308,991 A | 1/1982 | Peinetti et al. | 236/46 R |
| 4,322,297 A | 3/1982 | Bajka | 210/742 |
| 4,344,000 A | 8/1982 | Schornack et al. | 307/132 E |
| 4,361,274 A | 11/1982 | Raleigh et al. | 236/21 B |
| 4,368,549 A | 1/1983 | Ramey | 4/493 |
| 4,385,357 A | 5/1983 | Davis et al. | 364/500 |
| 4,385,724 A | 5/1983 | Ramsauer et al. | 236/25 |
| 4,393,527 A | 7/1983 | Ramey | 4/493 |
| 4,398,789 A | 8/1983 | Pryor | 350/96.1 |
| 4,403,157 A | 9/1983 | Guajardo et al. | 307/297 |
| 4,404,697 A | 9/1983 | Hatcher | 4/492 |
| 4,409,694 A | 10/1983 | Barrett, Sr. et al. | 4/545 |
| 4,421,270 A | 12/1983 | Raleigh et al. | 236/20 R |
| 4,564,962 A | 1/1986 | Castleberry et al. | 4/543 |
| 4,570,216 A | 2/1986 | Chan | 364/143 |
| 4,621,613 A | 11/1986 | Krumhansl | 126/416 |

(List continued on next page.)

Primary Examiner—Josie Ballato
Assistant Examiner—Sharon Polk
(74) Attorney, Agent, or Firm—Larry K. Roberts

(57) ABSTRACT

A control system for a pool and spa. Main line voltage is provided through a single line voltage service and a single ground fault circuit interrupter circuit, facilitating a ground fault test and simplifying installation. The control system controls the pool and spa equipment, with a circuit board assembly including individual fuse protection devices and switching circuits. A test algorithm is included, wherein the control system is disabled from normal operation if the GFCI test fails. The pool operator manually enters a water fill command, and the controller system automatically opens the fill valve for a predetermined time interval, and then automatically closes the valve. An emergency disconnect switch is mounted near the bathing area, connected by low voltage wiring to the controller system cabinet. The controller system senses the emergency switch closure and disconnects line voltage to the line voltage loads. The emergency switch closure also remotely induces a ground fault, tripping the GFCI. A sensing circuit allows the controller system to sense the presence of the emergency switch system, and issues a warning and prevents normal operation of the pool and spa system if not connected. A gas pressure sensor monitors the natural gas line, and the heater is disabled and a warning given under low pressure conditions. Abnormal filter backpressure triggers a warning when the filter needs service. A temperature sensor has parallel sensing elements in a common housing to provide separate sensing circuits.

28 Claims, 19 Drawing Sheets

U.S. PATENT DOCUMENTS

| | | | |
|---|---|---|---|
| 4,676,914 A | 6/1987 | Mills et al. | 210/741 |
| 4,685,158 A | 8/1987 | Lively | 4/508 |
| 4,742,456 A | 5/1988 | Kamena | 364/400 |
| 4,763,365 A | 8/1988 | Gerondale et al. | 4/542 |
| 4,773,008 A | 9/1988 | Schroeder et al. | 364/400 |
| 4,780,917 A | 11/1988 | Hancock | 4/544 |
| 4,828,626 A | 5/1989 | Meincke | 134/22.1 |
| RE32,960 E | 6/1989 | Levine | 364/557 |
| 4,844,333 A | 7/1989 | Davis et al. | 236/51 |
| 4,851,708 A | 7/1989 | Palmer | 307/141 |
| 4,854,498 A | 8/1989 | Stayton | 236/12.12 |
| 4,941,608 A | 7/1990 | Shimizu et al. | 236/12.12 |
| 4,967,382 A | 10/1990 | Hall | 364/557 |
| 5,079,784 A | 1/1992 | Rist et al. | 4/542 |
| 5,091,095 A | 2/1992 | Fries | 210/742 |
| 5,117,233 A | 5/1992 | Hamos et al. | 340/825.69 |
| 5,175,047 A | 12/1992 | McKenney et al. | 428/209 |
| 5,208,923 A | 5/1993 | Stiver | 4/493 |
| 5,226,408 A | 7/1993 | Drysdale | 126/247 |
| 5,245,221 A | 9/1993 | Schmidt et al. | 307/112 |
| 5,278,455 A | 1/1994 | Hamos | 307/139 |
| 5,311,451 A | 5/1994 | Barrett | 364/550 |
| 5,329,991 A | 7/1994 | Mehta et al. | 165/12 |
| 5,381,954 A | 1/1995 | Tokizaki | 236/78 D |
| 5,415,221 A | 5/1995 | Zakryk | 165/38 |
| RE35,018 E | 8/1995 | Homan | 236/12.12 |
| 5,457,826 A | 10/1995 | Haraga et al. | 4/541.4 |
| 5,548,854 A | 8/1996 | Bloemer et al. | 4/541.6 |
| 5,585,025 A | 12/1996 | Idland | 219/497 |
| 5,616,239 A | 4/1997 | Wendell et al. | 210/86 |
| 5,628,896 A | 5/1997 | Klingenberger | 210/86 |
| 5,682,754 A * | 11/1997 | Groenewold | 62/179 |
| 5,684,717 A | 11/1997 | Beilfuss et al. | 364/550 |
| 5,708,548 A | 1/1998 | Greeve et al. | 361/42 |
| 5,730,861 A | 3/1998 | Sterghos et al. | 210/86 |
| 5,804,080 A | 9/1998 | Klingenberger | 210/739 |
| 5,809,796 A * | 9/1998 | Zakryk | 62/238.6 |
| 6,109,050 A * | 8/2000 | Zakryk | 62/238.6 |

\* cited by examiner

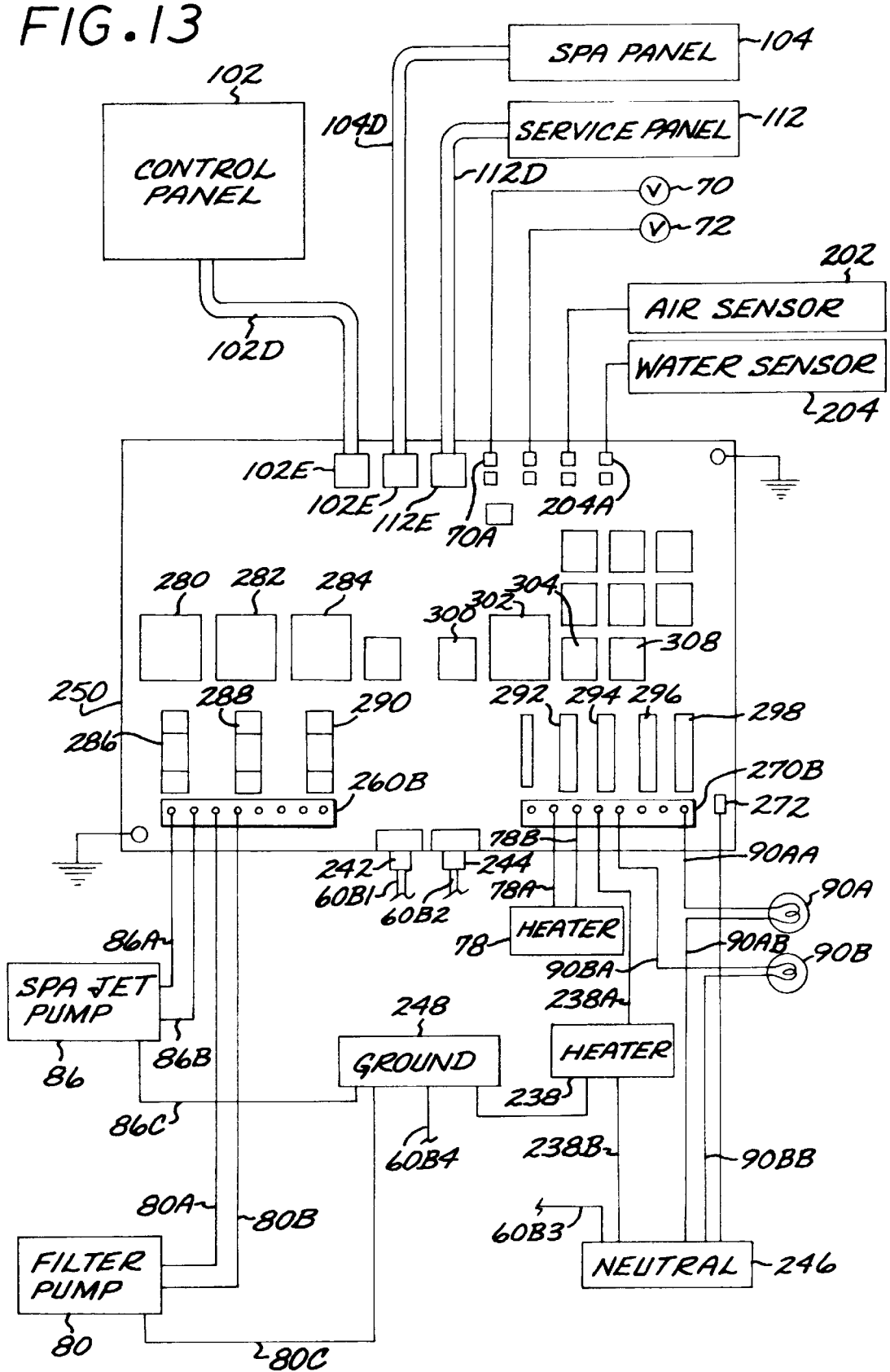

CONTROLLER SYSTEM FOR POOL AND/OR SPA

TECHNICAL FIELD OF THE INVENTION

This invention relates to controller systems for pools and spas.

BACKGROUND OF THE INVENTION

Electronic control systems have been employed to control various functions. Typically, however, the power hookups for the different components associated with the pool or spa have been run directly through circuit breakers in a main or auxiliary panel to the various components, such as the pump, heater and lights. This is a time consuming task, and one which can lead to wiring mistakes, in view of the number of wiring connections which need to be made. There is therefore a need to simplify the power hookups to the various components, in order to control costs and provide more reliable installations.

A problem with pools is maintaining the level of water within the pool. Evaporation losses can be significant, and so it is advantageous to have an automated system for keeping the water level at a given desired level. Stand alone systems for doing this are known, but tend to be somewhat complex. It would be advantageous to integrate such a system with the pool controller, for reliability, ease of installation and cost savings.

Emergency shutoff switches are typically mounted close to the spa, to enable quick shutoff of pumps and other functions in an emergency. It would be an advantage to provide an electrical shutoff switch which did not require high power connections to the switch, and whose installation could be verified by the controller.

Ground fault circuit interruption devices are typically employed in pool and spa controls. It would be an advantage to provide a technique for testing for proper operation and installation of these circuits.

The pool plumbing system typically includes a filter system for removing particulates from the pool or spa water. These commonly use diatomaceous earth or other filtering agents. As the filter becomes filled with particulates removed from the water, the filter back pressure rises, and ultimately for proper operation the filter must be cleaned, e.g. by backflushing the filter. Presently, a sight pressure gauge is mounted on the filter, so that the pool maintenance technician can visually check the back pressure status. It would improve the maintenance of the filter operation to automate the pressure reading.

The water circulation system for the pool/spa also includes a heater for warming the pool and/or spa water for the user's comfort. This heater is typically gas-operated, and does not operate properly when the gas pressure is too low. It would therefore improve the reliability and operation of the water circulation system if a technique could be found to monitor the gas pressure and provide a message and/or control signals in the event of a low gas pressure condition.

Power loads imposed by the pool system's electrical components can be considerable. Techniques for efficiently using the power load rating of the control system are therefore needed.

SUMMARY OF THE INVENTION

A control system for a pool and spa installation is described, which provides for a simplified installation with effective ground fault protection. Main line voltage service for the pool and spa equipment is provided through a single line voltage service and a single ground fault circuit interrupter (GFCI) device. The control system acts as a distribution system for controlling the pool and spa equipment, with a circuit board assembly including individual circuit protection devices and switching circuits. Because the primary line voltage supply is through a single GFCI, testing of proper ground fault operation is facilitated through a ground fault test. Moreover, the installation costs of the control system are substantially reduced over those of conventional pool controller systems, because many of the wiring connections are made on the circuit board assembly.

The controller system is housed in a metal cabinet with a main bay in which all line voltage wiring is routed, and a plurality of secondary bays isolated from the main bay, through which low voltage wiring is routed from the main bay. The controller system includes a printed circuit board assembly which is configured for ready removal and replacement from the cabinet without the need for disconnecting the line voltage conductors from a set of pressure connectors attaching the connectors to a terminal block. The controller system is configured for field wiring.

A power management improvement is provided, wherein the line voltage service to the controller system is a line service, e.g. 240 VAC, and two line voltage 120 VAC loads are powered, one from a first circuit connected between a first line voltage phase conductor at 120 VAC and a neutral conductor, the other from a second circuit connected between a second line voltage phase conductor at 120 VAC and the neutral conductor. The two line voltage loads can be lighting circuits in an exemplary embodiments.

In accordance with another aspect of the invention, a test algorithm is implemented with the controller system, wherein the control system is prevented from normal operation if the GFCI test fails to indicate that the GFCI is operating properly.

Another aspect of the invention is an automated pool filling facility, wherein the pool owner manually enters a fill command through the controller panel, and the controller system automatically opens the fill valve for a predetermined time interval, and subsequently automatically closes the fill valve when the time interval elapses. Thus, the owner need only provide the initial instruction to add water to the pool, and does not have to remember to close the valve some time later.

An intelligent emergency disconnect switch system can be included with the controller system. The switch system is mounted near the pool or spa area, for ready access in the event of an emergency situation in which the line voltage loads such as the water pump should be shut down immediately. The switch system is connected by low voltage wiring to the controller system cabinet. The controller system senses the closure of the emergency switch and opens the switches or relays providing line voltage to the line voltage loads controlled by the system. Closure of the emergency switch also remotely induces a ground fault, which will result in tripping the GFCI, and interrupting line voltage supply to the controller system. Thus, the emergency switch system has redundant line voltage interrupt facilities. The emergency switch system also includes a sensing circuit feature through which the controller system can sense the presence of the emergency switch system. The controller system can issue a warning message or prevent normal operation of the pool and spa system if the controller system detects that the emergence switch system is not connected.

In accordance with another aspect of the invention, the pool and spa service system includes a gas pressure sensor mounted in the natural gas line running to the water heater. The sensor provides gas pressure signals which are monitored by the controller system. If the gas pressure is below a threshold pressure, e.g. a minimum pressure for reliable heater operation, the system will shut down the heater, and provide a warning message on the control panel display. The service system also includes water pressure sensing to monitor the filter backpressure, and provide a warning message on the control panel display in the event the backpressure indicates that the filter needs service.

Another aspect of the invention is in an improved temperature sensor for sensing air or water temperature. Parallel variable resistance elements such as thermistors are incorporated in a common housing to provide separate temperature sensing circuits which can be read by the system controller. The use of multiple sensing circuits provides redundancy, and provides two temperature readings which are monitored by the controller.

Other features and advantages are described.

BRIEF DESCRIPTION OF THE DRAWING

These and other features and advantages of the present invention will become more apparent from the following detailed description of an exemplary embodiment thereof, as illustrated in the accompanying drawings, in which:

FIG. 13 is a schematic diagram of a simplified pool service system in accordance with the invention.

DETAILED DESCRIPTION OF THE PREFERRED EMBODIMENTS

Figure 1:
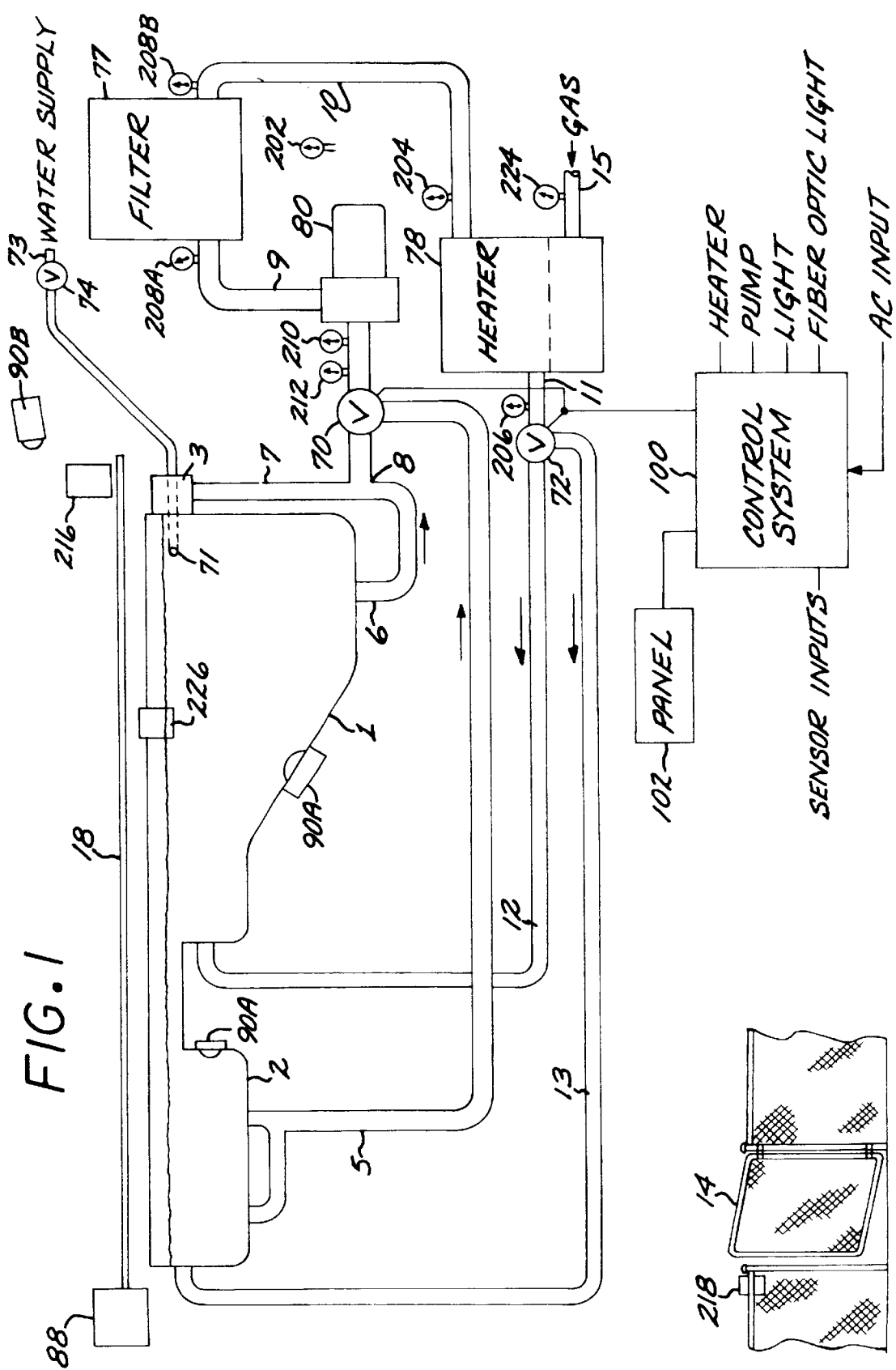
FIG. 1 is a diagrammatic view of a pool and spa system utilizing aspects of this invention.

FIG. 1 is a diagrammatic view of a pool and spa system utilizing aspects of this invention. In this embodiment, the pool 1 and spa 2 share filter 77 and heater 78 through a plumbing arrangement including three-way valves 70 and 72, although other arrangements can be employed, such as separate heaters and filters for the pool 1 and spa 2. A conventional skimmer 3 is included, and its drain line 7 and the pool drain line 6 are joined at a junction tee before connection to one input of the valve 70. The drain line 5 from the spa is connected to the other input of valve 70. The valve output is connected to the input side of the filter pump 80 through water line 8. A water line 9 runs from the pump output to the filter input. The filter output is connected by water line 10 to the heater input. The heater output 11 is connected to the input of the three-way valve 72. One output of the valve is connected to water line 12 leading to a pool inlet. The other output of valve 72 is connected to water line 13 leading to a spa inlet.

The system includes pool and spa lights 90A, yard lights 90B, and a decorative fiber optic lighting system 88 typically mounted along the pool coping.

To the extent just described, the pool and spa system is conventional. In accordance with aspects of the invention, a controller and power distribution system 100 is provided, which controls operation of the system 50, and which receives AC line voltage service, and distributes line voltage to the line voltage loads, including the heater, pump, lights and fiber optic lighting. The controller 100 further controls the operation of the line voltage loads, and the valves 70 and 72. Moreover, the controller 100 receives input data from a variety of sensors, including a gate open alarm 218, a pool cover alarm 216, water pressure sensors 208A (filter input pressure) and 208B (filter output pressure), gas pressure 224 for the gas supply line 15 to the heater, temperature sensor 204 (temperature of water entering the heater), temperature sensor 206 (temperature of water leaving the heater), and water ph and oxygen reduction potential (ORP) sensors 212 and 214 in the water line 8. A master control panel 102 is coupled to the controller 100 for providing a display and command and data input device by which the system 100 communicates with a user. The locations of the various sensors may vary depending on the installation. For example, the water temperature sensor 204 may alternatively be placed at the inlet to the pump 80, in the water line between the valve 70 and the pump 80.

Figures 2, 3, 4, 5:
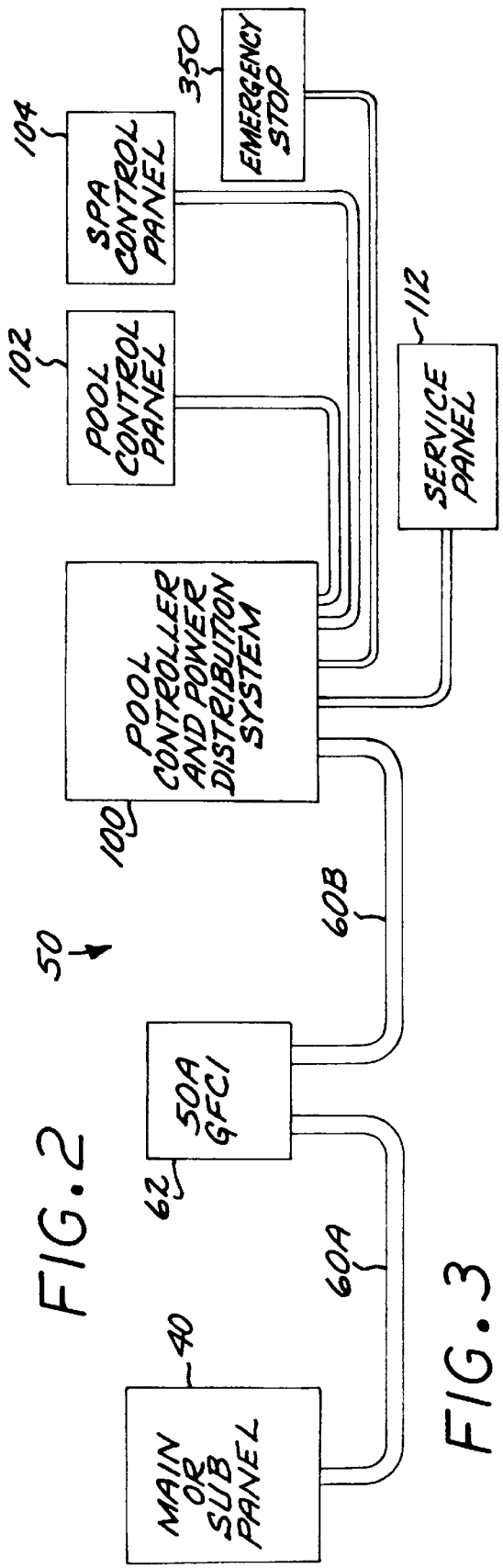
FIG. 2 is a simplified block diagram of elements of a pool service system embodying this invention.
FIG. 3 illustrates a control panel cabinet for housing the pool controller and power distribution system of the pool service system, and the service control panel mounted on the cabinet.
FIG. 4 is a diagrammatic view of the pool control panel comprising the system of FIG. 2.
FIG. 5 is a diagrammatic view of the spa control panel comprising the system of FIG. 2.

FIG. 2 is a simplified block diagram of a pool service system 50 embodying this invention. This embodiment will be described in the context of a residential pool with spa as illustrated in FIG. 1, although it is to be understood that the system can be utilized with larger pool installations, such as hotel/motel pool systems and the like. The system includes the controller and power distribution system 100, which receives AC line power from the main or sub line voltage distribution panel 102. In this example, the panel 102 supplies 50 Amp service on line voltage wiring 60A, which is connected to a ground fault circuit interrupter (GFCI) circuit 62, and then through line voltage wiring 60B to the controller and power distribution system 100. As will be described in further detail below, the system 100 distributes line voltage power to various line voltage loads, and also includes a low voltage transforming function to provide low voltage AC and DC power at various low voltages need by the electronic devices and low voltage loads.

In contrast to prior techniques for wiring up pool equipment, the main line voltage power is provided through a single main line voltage service connection 60A, 60B and GFCI 62 to system 100, rather than through a plurality of line voltage service connections each with its own GFCI circuit and circuit breaker circuit. This simplifies the wiring effort and labor involved in a new installation. The system 100 is not limited to the 50 Amp main line service, and can include auxiliary line services 64 and 66, which can be used to power auxiliary loads through conventional circuit breaker-protected connections. Typically these auxiliary connections are made on auxiliary circuit boards mounted in the control cabinet.

The system 50 will typically also include the master pool control panel 102 as well as a spa control panel 104. The pool control panel can be located inside the residence, adjacent a door leading out to the pool, or in other locations convenient for the user. The pool control panel could also be installed on the cover of the controller cabinet 112. The spa control panel 104 is typically located adjacent the spa for convenient access by spa users.

FIG. 3 illustrates a control panel cabinet 110 for housing the system 100, and which also includes a service control panel 112, which includes several touch switches 112A and status indicator lights 112B. Techniques for constructing a suitable control panel are described in U.S. Pat. No. 5,332,944. The switches permit user commands to be entered at the cabinet 110. If the pool control panel is mounted on the cover of the cabinet 110, the service panel would be omitted. The service panel 112 in this exemplary embodiment includes eight manually actuated control switches/buttons. These are used to turn on or enable the filter pump, the pool and spa lights, the heater, and five auxiliary buttons which can be used for such features as the cleaner pump, yard lights, an auxiliary valve, a fiber optic decorative lighting system and an auxiliary pump. The service panel is located on the exterior of the hinged lockable cover for the cabinet 110, and is fully water resistant. This mounting provides a significant safety benefit, since the pool service professional or homeowner does not need to open the system cabinet 112, exposing line voltage wiring, in order to do routine pool maintenance.

FIG. 4 illustrates the master control panel 102, which in this exemplary embodiment includes an LCD or other display 102A, panel switches 102B and indicator lights 102C. This panel 102 includes a display for displaying to the operator various status information and messages, and controls which permit the operator to enter commands or input data to the system 100. The switches accept user commands and inputs, to initiate system actions or enter information into the controller 100. For example, the switches or buttons can include up and down buttons for temperature control and programming, a filter button for activating the filter pump, a light button for controlling the pool and spa lights, a spa button which controls the valves 70 and 72, turns on the spa jet pump, and turns off the cleaner pump if the system is so equipped, a heater enable button to enable operation of the heater, a program button to put the system in a programming mode, and five auxiliary buttons which can be used for such features as the cleaner pump, yard lights, an auxiliary valve, a fiber optic decorative lighting system and an auxiliary pump.

FIG. 5 is a similar view of the spa control panel 104, which also includes an LCD or other display 104A, panel switches/buttons 104B and indicator lights 104C, which accepts user commands and inputs, to initiate systems actions or enter information into the controller 100. In an exemplary embodiment, there are four buttons, one button for temperature control, one button to control the spa jets (valves and filter pump) and an optional jet pump, a spa light button, and an auxiliary button. The panel 104 is mounted in or near the spa 2, above the water line. A low voltage cable runs from the panel to the controller system 100.

Figure 6:
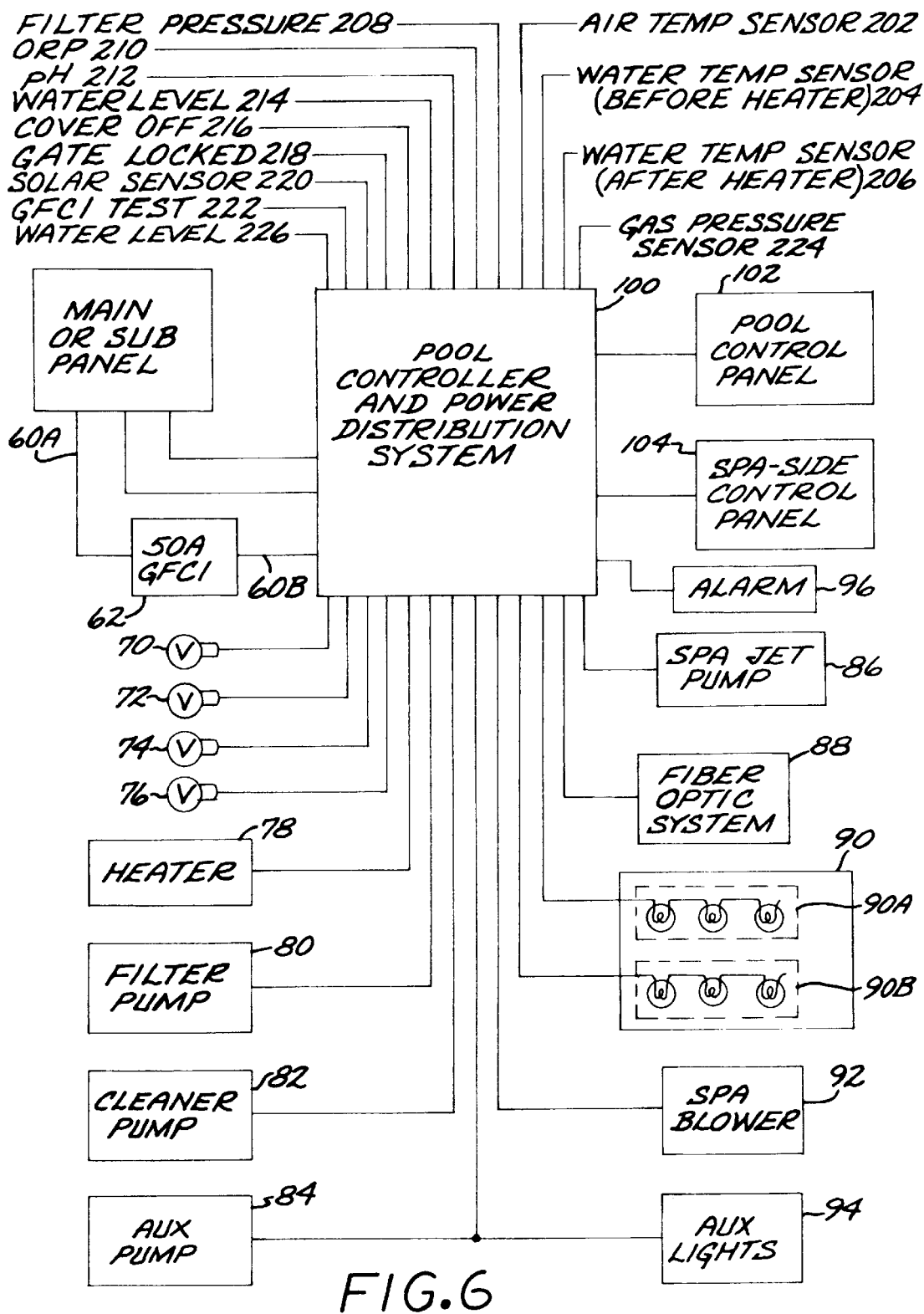
FIG. 6 is a detailed block diagram of the pool service of FIG. 2.

FIG. 6 is a schematic block diagram of the pool service system 50. The service system includes a number of components which require electrical power for operation and/or control. In accordance with an aspect of this invention, the electrical power at line voltage is routed through a pool controller and power distribution system 100. Primary electrical power is by the 50 Amp primary service 60 from the main panel or 100 Amp sub panel 40. Of course, the particular ampere ratings for the circuits of this system are merely exemplary, and could be varied in accordance with the demands of particular applications. The primary service 60 is provided with a ground fault continuity interrupt (GFCI) circuit 62, to provide ground fault protection for the primary power service to the system. Auxiliary electrical power service is provided in this example by a 20 Amp service line 64 and a 30 Amp service line 66, although the auxiliary service can be omitted for many applications.

Figure 9:
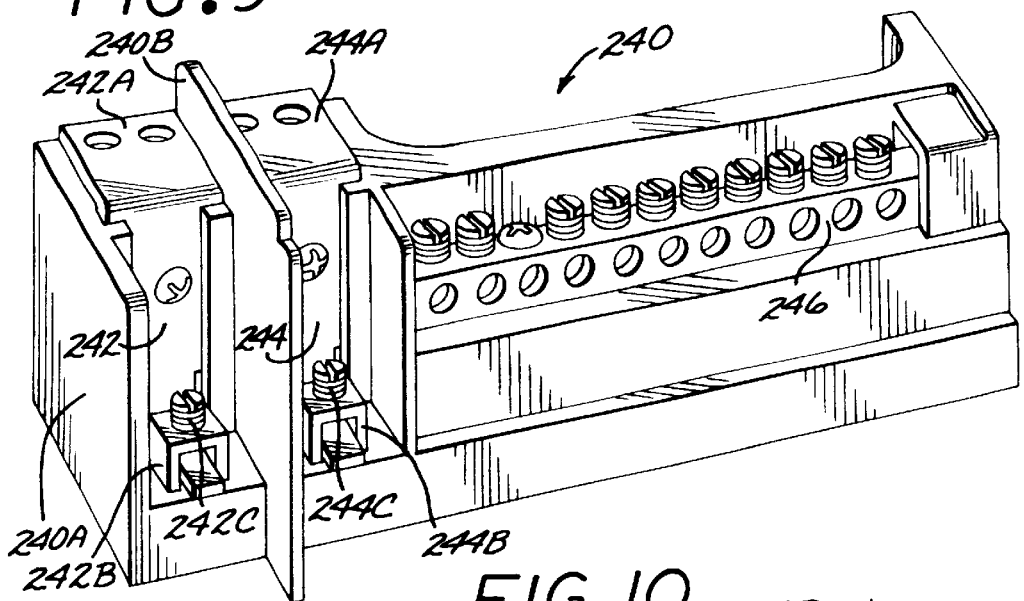
FIG. 9 is an isometric view of the connector terminal block used in the control cabinet for connecting line voltage wiring.

The primary line voltage service 60 is provided by a 240 VAC line feed, comprising in a typical installation a neutral conductor, a ground conductor, a first voltage phase conductor and a second voltage phase conductor. These conductors are conventionally color coded, so that according to the coding convention, the ground conductor has green insulation, the neutral conductor has white insulation, the first voltage phase conductor has black insulation and the second voltage phase conductor has red insulation. The black conductor has a first polarity phase with respect to the neutral conductor, and the red conductor has a second polarity phase with respect to the neutral conductor, and 180 degrees different from the phase of the first polarity phase, such that 120 VAC is developed between the neutral and the black conductors, 120 VAC is developed between the neutral and the red conductors, and 240 VAC is developed between the black and the red conductors. In the embodiments described below, the 50 Amp service 60B includes red conductor 60B1, black conductor 60B2, white (neutral) conductor 60B3, and green (ground) conductor 60B4 (see FIG. 9).

Various components which are controlled and/or receive electrical operating power through the system 100 are shown in FIG. 6. These components can include the valves 70, 72, 74, the pool fill spout valve 76, the pool water heater 78, the filter pump 80, the cleaner pump 82, an auxiliary pump 84, a spa jet pump 86, the decorative fiber optic system 88, lighting system 90, spa blower 92 and auxiliary lights 94. The foregoing particular components is an illustrative listing; for any given pool installation, some of the components will be omitted, and other components may be added, all depending on the design of the particular installation.

The pool controller 100 receives input data signals from various sensors and input sources. These include several temperature sensors, the air temperature sensor 202 for providing ambient air temperature, the water temperature sensor 204 for providing the temperature of the water at the input to the heater, and the water temperature 206 for providing the temperature of the water at the output of the heater. Other sensors include the filter backpressure sensor system 208 comprising pressure sensors 208A and 208B, ORP sensor 210, pH sensor 212, water level sensor 214 for providing a pool water level indication, a "cover off" sensor 216, a "gate locked" sensor 218, a solar sensor 220 for detecting the temperature at a solar heater, and an emergency stop switch 350, to be described in greater detail below. As is known in the art, the controller can respond to the solar temperature, to actuate a valve to divert water to pass through a solar heater, if the installation is so equipped, instead of through the gas water heater. The water level sensor for example can include a probe which extends into an area at which the water level will reach at a desired fill level, and sense the presence or absence of water at this level.

In accordance with an aspect of the invention, a direct 50 Amp line power connection is made between the main panel 40 for the residence directly to the pool controller and distribution system 100, through the 50 Amp GFCI circuit 62. The system 100 has thereon the necessary terminal connections for direct connection of the line voltage service conductors (black, red, white, green) for the 50 Amp service. Circuit protection for the various devices such as the heater 78, filter pump 80, cleaner pump 82 and auxiliary pump 84 is provided by circuit protection devices, e.g. fuses, mounted on the pool controller circuit board in the pool controller cabinet. This results in substantial savings and cost and in assembly time and effort.

A typical power connection in accordance with this aspect of the invention is illustrated in FIGS. 8–12. To facilitate the connection of power to the controller board, an insulating terminal block 240 is employed within the controller cabinet 110, which carries pressure connectors 242 and 24 to which the red and black line voltage conductors are attached. The connectors 242, 244 each include a frame 242B, 244B into which the end of the respective line voltage conductor is inserted. A threaded device such as set screw 242C, 244C is then advanced into the frame, capturing the end of the line voltage conductor in the frame by a pressure connection.

The terminal block body 240A is fabricated of an electrically insulating material, i.e. a dielectric, and is mounted to the floor of the cabinet. The terminal block includes mounting surfaces which receive threaded fasteners 251 to secure the controller circuit board to the terminal block, and through pressure contact, make electrical contact with the red and black line voltage connectors. An upstanding wall portion 240B protrudes upwardly, through a slot 250A formed in the edge of the circuit board 250. The wall portion 240B registers the position of the terminal block in relation to the circuit board, and also physically provides dielectric isolation between the line voltages carried by the connectors 242 and 244 carry.

Conductive traces on the circuit board 250 contact respective line voltage connector surfaces 242A and 244A (FIG. 9) of the connectors 242 and 244 to provide electrical continuity between the circuit board traces and the red and black line voltage conductors. Representative circuit board traces are shown in FIGS. 7 and 8.

Figure 7:
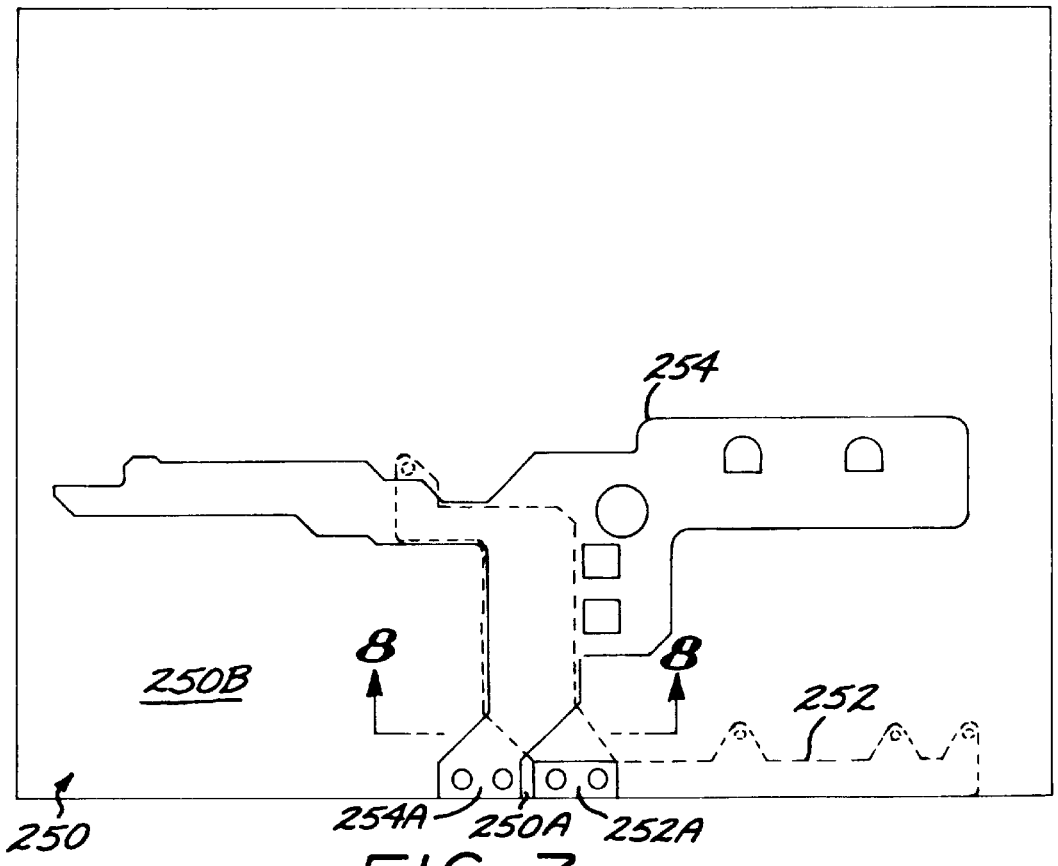
FIG. 7 is a top view illustrating a portion of the multilayer conductive trace pattern of the controller circuit board.
Figure 8:
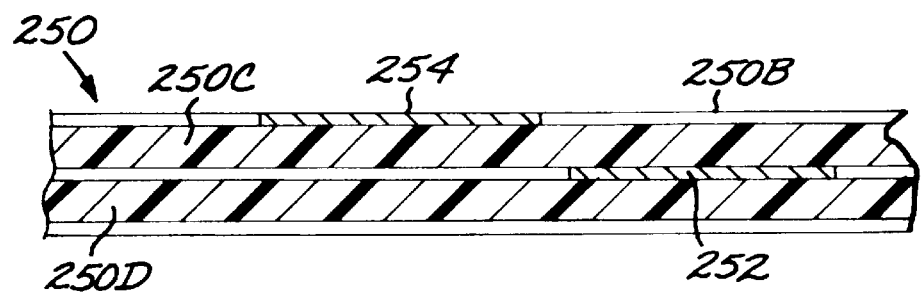
FIG. 8 is a cross-sectional view taken along line 8—8 of FIG. 7.

FIG. 7 is a simplified bottom view of the circuit board 250, and illustrates printed wiring conductor patterns for carrying line voltage at 120V, at the respective first phase and the second phase. Circuit trace 252 is connected to the red wiring connector 242, and includes pad 252A exposed on the bottom surface 250B of the board, for contacting connector surface 242A upon assembly of the board to the terminal block 240.

In this embodiment, the circuit board 250 is a multiple-layer structure, with conductor traces formed on the top surface, the bottom surface and in a buried intermediate layer, using known photolithographic techniques, with conductive vias interconnecting the circuit traces on the different layers as required to form the desired circuit. The circuit trace 252 is mostly formed in the buried layer, and is shown in phantom lines in FIG. 7. Thus, the circuit trace pattern 252 is generally a buried layer, except for conductive pad 252A formed on the bottom surface 250B. The trace pattern 252 then transitions through a conductive via to a buried layer, sandwiched between layers of dielectric comprising the board 250. This is shown in the cross-sectional view of FIG. 8, wherein trace 252 is sandwiched between board dielectric layers 250C and 250D. The circuit trace 254, connected to the black conductor 60B3 through connector 244, is a surface trace pattern, and is shown in solid line in FIG. 7.

The circuit board 250 thus includes layers of printed wiring patterns, which route the line voltage and low voltage signals to respective devices mounted on the board, and to the connectors to which are connected wiring running to the line voltage loads and low voltage devices. By use of this circuit board arrangement, the labor involved in wiring a given installation is substantially reduced, and the circuit board can be easily removed for servicing, if necessary.

To facilitate the safe routing and separation of low voltage conductors from high voltage conductors, the cabinet 110 for the system 100 is separated into three compartments or bays, two low voltage compartments 110J and 110K on either side of the middle compartment 110I. The cabinet 110 in this embodiment is a metal housing structure having a hinged cover 110A, side walls 110B–110E and floor 110F. Interior metal wall partitions 116G and 110H of the cabinet define the three compartments. All line voltage wiring enters the cabinet at the bottom wall through holes formed in wall 110B, and remain in the main compartment. The ends of the line voltage wiring are captured in pressure connectors, including the connectors 242, 244. Pressure connectors suitable for the purpose are commercially available, e.g., a pressure connector marketed by Connector Mfg. Co. of Alabama, Grenville, Ala. as part number CA-66. Low voltage wiring is brought from the main compartment through openings in the side walls and through wall 110B at openings in the side compartments. This results in improved safety, since any failure of insulation on a line voltage line could cause a dangerous voltage on the low voltage lines.

FIG. 13 is a simplified wiring diagram for an exemplary pool and spa installation. For some installations, not all sensors and controlled devices may be needed or desired by the owner, and the system shown in FIG. 13 does not explicitly show the identical complement of controlled devices and sensors as shown for the system of FIG. 6. It is contemplated that the same controller circuit board will be used in this installation as well as in the system shown in FIG. 6. The exemplary installation of FIG. 13 includes controlled valves 70 and 72, air temperature sensor 202, water temperature sensor 204 which measures the temperature at the inlet to the heater, which should be the same as the water temperature in the pool or spa, spa jet pump 86, filter pump 80, water heater 78, spa lights 90A and yard lights 90B.

The circuit board 250 is diagrammatically depicted in FIG. 13, and is connected to the line voltage connectors 242 and 244, attached to the terminal block connector 240. The neutral bus 246 is attached to the terminal block, and a neutral connection 246A is made to the circuit board. The neutral (white) conductor 60B3 from the 240 VAC, 50A service is connected to the neutral bus. The ground (green) conductor 60B4 from the 50A service is connected to a ground bus 248 attached to the metal cabinet 110. The board 250 includes printed wiring conductor patterns which connect the various circuit devices mounted on the board and the connector terminals.

The board 250 is supported on the metal cabinet 110, and ground is connected through metal threaded fasteners 258 (FIGS. 10–12) which secure the board in place. Extending from the sidewall partitions 110H and 110G are metal brackets comprising shelf portions 110L and 110N, supported by metal leg portions 110M and 110P, respectively. The fasteners 258 secure the board 250 to the shelf portions. Thus, the board is physically connected to the cabinet 110 by four threaded fasteners 258, and to the terminal block 240 by four threaded fasteners 251, in this exemplary embodiment. This attachment technique facilitates the installation and removal of the board 250 relative to the cabinet. Of course, other types of removable fastener structure could alternatively be employed instead of screw fasteners, including clamps, spring clips, friction connectors, and the like.

The exemplary installation illustrated in FIG. 13 includes two 240 VAC loads, the spa jet pump 86 and the filter pump 80. These loads are connected to 240 VAC service through a 240 VAC connector 260 comprising a first connector structure 260A (FIG. 10) mounted on the top surface of the circuit board, and a removable connector structure 260B (FIG. 13) to which insulated conductors or wires are connected running to the loads. The respective connector structures have respective pins and corresponding plug receptacles which mate together when the connector structure are mated. Such connectors are well known; a suitable connector is the connector marketed by RIA Electronics, Inc., Etherton, N.J., as mating parts 31041208 (pin connector) and 31007208 (plug connector). Use of this type of connector structure facilitates field wiring of the line voltage loads.

Respective terminals of the connector structure 260A are electrically connected to printed wiring trace 252 running to the connector 242, and other connections to other terminals of the connector structure 260A are made through switching relays and fuses to wiring trace 254 to the connector 244. By appropriate connection to respective terminals of the connector structure, 240V service is available. Insulated conductor 86A is connected to a "red" terminal connection, i.e. a connection which is electrically connected to connector 242, to which the red conductor of the 240V service is connected. Conductor 86B is connected to a "black" terminal connection, i.e. a connection which is electrically connected through a relay and fuse to connector 244, to which the black conductor of the 240V service is connected. Conductor 86C connects the ground bus 248 to the spa jet pump.

Similar connections are made to the filter pump 80 to provide 240V service. Thus, wire 80A is connected to another "red" terminal connection on connector 260B, wire 80B is connected to a "black" terminal connection on connector 260B, and wire 80C connects the ground bus 248 to the filter pump.

The 240 VAC loads are controlled by respective switch devices, e.g. non-latching relays, in turn controlled by the system controller. Each load circuit is also protected from excessive current draw by a fuse device. Thus, the spa jet pump is controlled by relay 280 and circuit protection is provided by fuse 286, respectively mounted on the circuit board 250. To accomplish this, a series circuit connection is made between the circuit trace 254, relay 280 and fuse 286 to the corresponding terminal on connector structure 260A, using solder connections to wiring traces formed as part of the board 250. The filter pump 80 is controlled by relay 282 and circuit protection is provided by fuse 288. A spare 240V service circuit is provided, with relay 284 and fuse 290.

The circuit board 250 further has a 120V service connector 270, also comprising a fixed connector structure 270A mounted to the board, and a removable connector structure 270B (FIG. 13) connectable to the fixed connector structure. These connector structures can be implemented in the same manner as the connector structures 260A and 260B, further facilitating field wiring of the controller system. Insulated wires running to the load devices are attached to the removable connector structure 270B. Respective terminals of the connector structure 270A are electrically connected via wiring traces of the circuit board to the red connector 242, the black connector 244 and the neutral connector 272 in turn connected to the neutral bus 246 via wire 246A. Thus, 120V service of either phase (red or black) is available at the connector 270. The heater 78 is wired to the connector 270 by wires 78A, 78B. When the controller system calls for heat, 120 VAC power to activate the heater is supplied, which enables all ignition and temperature regulating functions of the heater. The heater in turn ignites gas supplied to its internal gas valve and burner, heating the water which is flowing from the pump and filter. The spa light circuit 90A are connected to a black polarity connection at connector 270 by wire 90AA, and to the neutral bus 246 by wire 90AB. The yard lights 90B are connected to a red polarity connection at connector 270 by wire 90BA, and to the neutral bus 246 by wire 90BB. Provision is made for an optional 120V load device 238, which can be connected to connector 270 by wire 238A, and to the neutral bus 246 by wire 238B.

Each 120 VAC circuit connected through the connector 270 is controlled by a switch device actuated by the controller 402, with circuit protection provided by a corresponding fuse, respectively mounted on the circuit board 250. The switch device and a corresponding fuse are connected in series between a corresponding line voltage wiring trace (i.e., black, red, white) and a terminal of the connector 270. The heater is controlled by relay 300, with circuit protection provided by fuse 292. The optional load 238 is controlled by relay 302 and protected by fuse 294. The yard light circuit 90B is controlled by relay 304, and protected by fuse 296. The spa light circuit 90A is controlled by relay 306, and protected by fuse 298.

The various electrically-powered components controlled and powered through the pool control system can give rise to power load issues, where the total current available through the pool control system could be insufficient to meet all load conditions. To provide power to the 120V lighting 90, two different 120V light circuits 90A and 90B are hardwired on the control board. One circuit, say 90A, is powered by connection to the black and white conductors of the 240 AC service. The second circuit is powered by connection to red and white conductors of the 240 VAC service, thus using a different phase of the 240 VAC service. With this arrangement, even though both circuits each draw up to 10 Amps at 120 VAC, the total power rating for both circuits is 10 Amps at 240 VAC.

Figure 21:
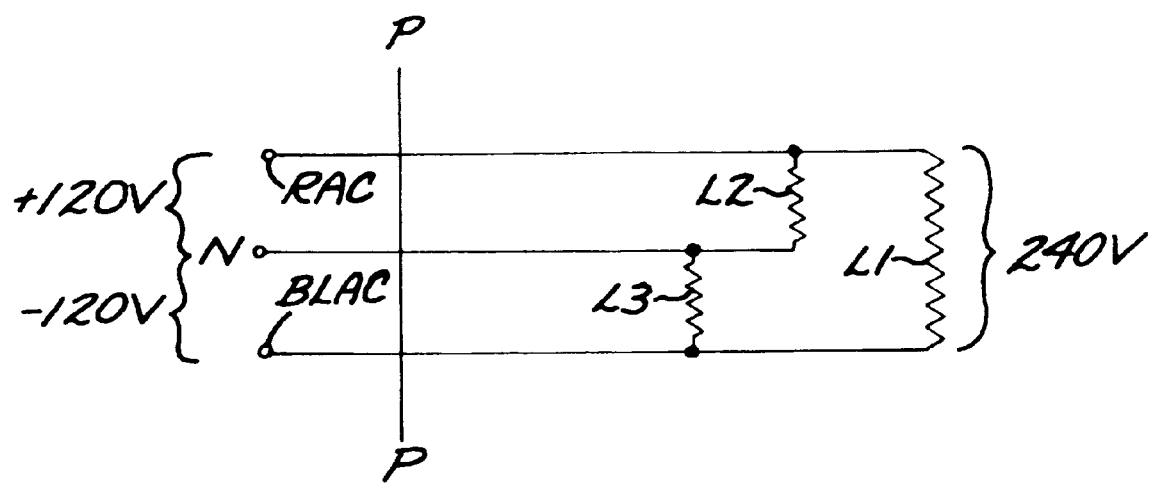
FIG. 21 illustrates connection of two 120 Amp line voltage loads using a 240 VAC 50 Amp service.

This feature of the invention is described with respect to the simplified schematic of FIG. 21. The rating of a 50 Amp 240 VAC circuit in the United States is achieved with two 120 VAC waveforms, which are 180 degrees out of phase. Thus, consider the node RAC (which could be connected to the red conductor of the 50 Amp service) to be at +120 VAC, and the node BLAC (which could be connected to the black conductor of the 50 Amp service) to be at −120 VAC. The voltage difference between the two nodes is thus the 240 VAC service, and the load L1 is a 240 VAC load. Current can flow through the load L1 to a maximum of 50 Amps in this 50 Amp circuit. However, if the total current through the load L1 is less than 50 Amps, the balance can be directed through loads L2 and L3, connected between RAC and the neutral conductor, and between BLAC and the neutral conductor, respectively. Loads L2 and L3 may or may not be equal, and the return path is through the neutral conductor, unused if all 50 Amps is not passed through the load L1. However, the total current passing through plane P—P is always 50 Amp. When loads L2 and L3 are equal, they act as virtual grounds for each other, and no current flows through the neutral leg. If these loads are unbalanced, the difference flows in the neutral leg to make up the 50 Amp current.

The system 100 further includes a transformer coupled to the 120V AC to provide low voltage DC power at 5V and 15V to provide power to the electronic components including the controller, and to operate the low voltage load devices, such as the valves 70, 72. The transformer is connected to the circuit board 250 to receive input 120V AC, and to provide the low voltage AC and DC supply voltage levels.

To further facilitate field wiring of the controller system 100, the service control panel 112, the control panel 102 and the spa control panel 104, the sensors, and the low voltage loads such as the valves, are connected to the circuit board 250 by low voltage cables and modular, telephone-jack-type connectors. In this way, the low voltage cables can be connected or disconnected easily by simply detaching removable connector portions from corresponding connector portions mounted on the board. Thus, referring to FIG. 13, for example, the control panel 102 is connected to the board 20 by a low voltage, multiple conductor cable 102D and a modular connector 102E having a male portion connected to the cable end and a female portion mounted to the board 250. The male portion is latched in place in the female portion, making electrical contact with the respective conductors, and can be detached by pressing a plastic latch tab and pulling the male portion away. Similar connections are made to the spa panel 104 and the service panel 112, through respective cables 104C, 112C and modular connectors 104D, 112D. Modular board connectors suitable for the purpose are commercially available, e.g. the telephone/data type connectors marketed by Berg as part numbers 93899-001 (6 position board connector) and 69255-001 (eight position board connector). The mating male connector structures attached to the cabling are also commercially available.

Similarly, the sensors and low voltage loads are also connected to the boards using modular connectors. The leads for these devices are connected to male connector structures, which are mated to respective female connector structure mounted on the board. For example, the wiring for valve 70 is connected to the board by modular connector structure 70A, and the wiring for sensor 204 is connected to the board by modular connector 204A. Suitable connector structures for sensor connector 70A include the Molex part numbers 705-43-0106 (board connector structure) and 14-56-8022 (wire connector structure). Suitable connector structures for valve wiring connectors include JST part numbers JST-32B-XH-4 (board connector structure) and JST-02NR-E2R (wire connector structure).

Figure 10:
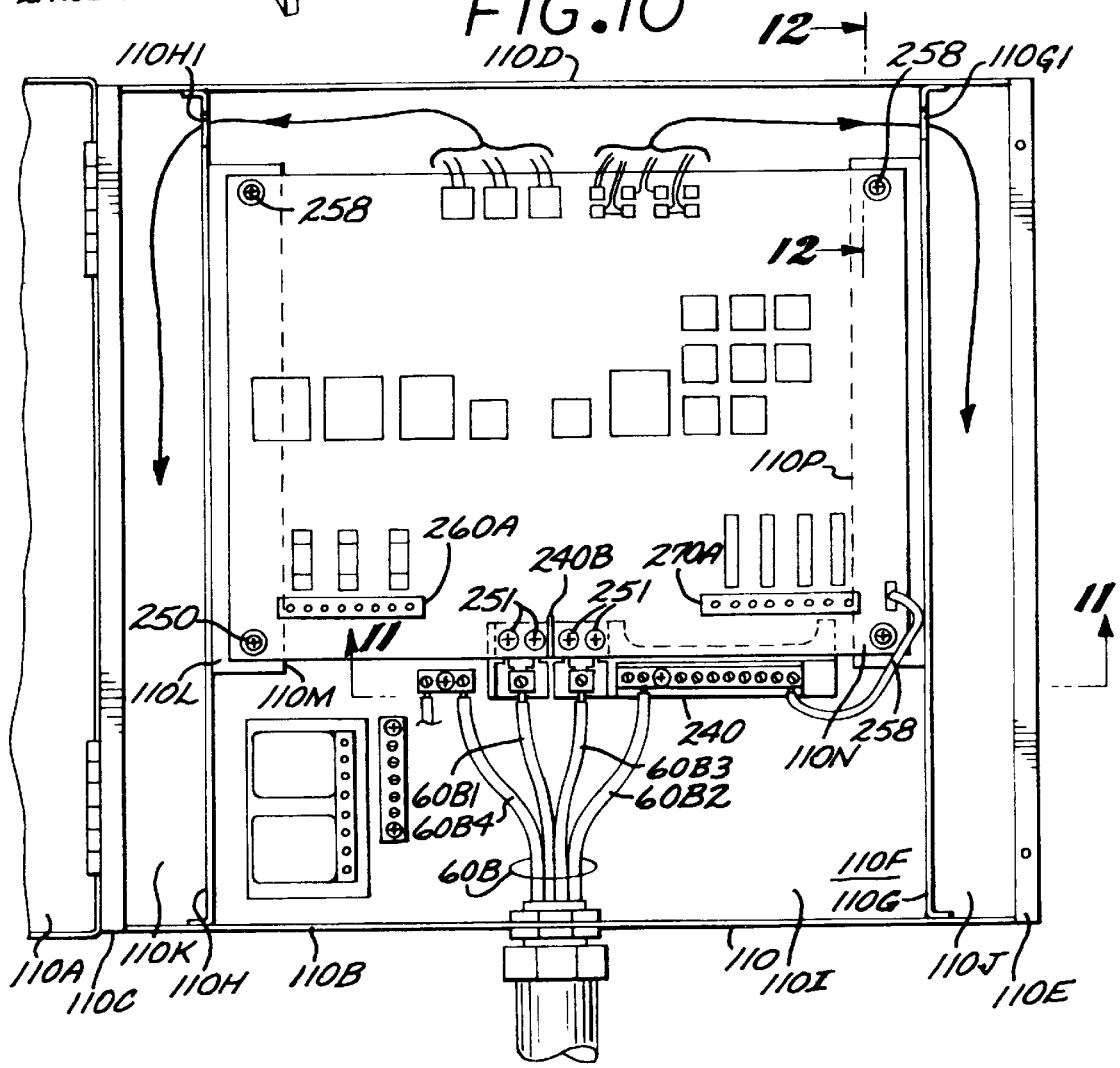
FIG. 10 is a top view of the control cabinet of FIG. 3, which the cover in a open position illustrate the controller circuit board and line voltage and low voltage connections, and the main compartment bay and the two side compartments through which low voltage wiring is passed.
Figure 11:
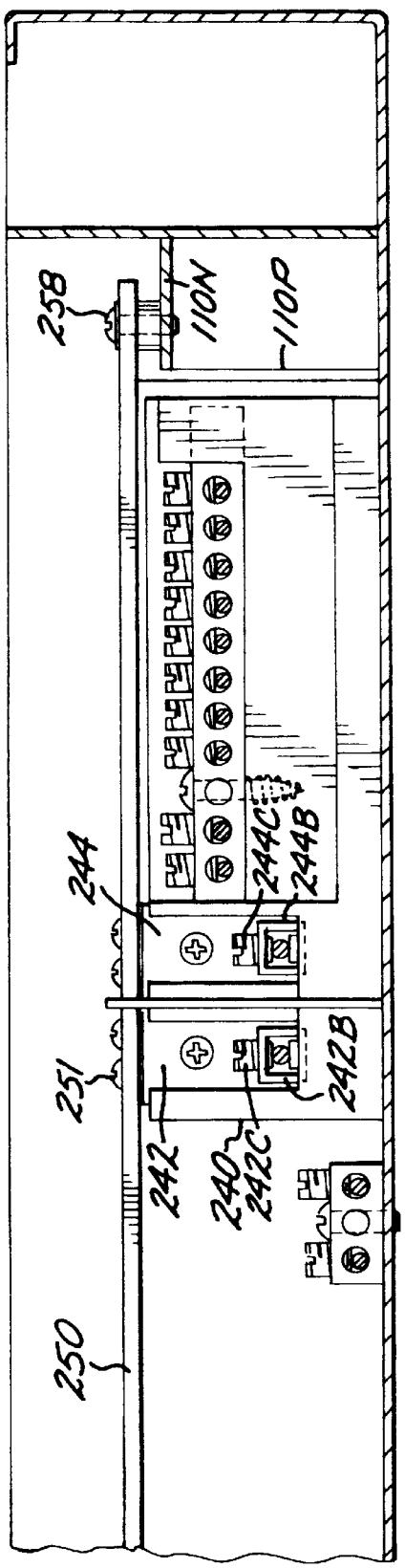
FIG. 11 is a cross-sectional view taken along line 11—11 of FIG. 10.
Figure 12:
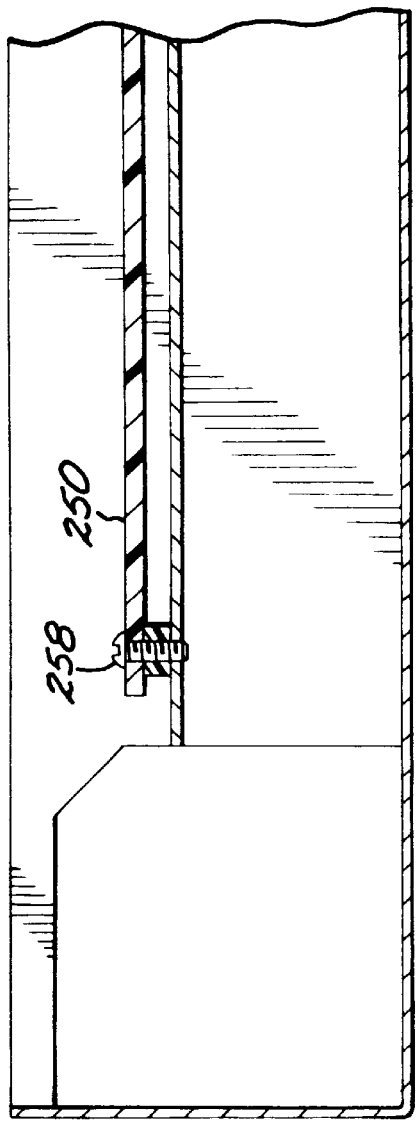
FIG. 12 is a cross-sectional view taken along line 12—12 of FIG. 10.

The low voltage cabling for the control panels is routed from the main bay 110F of the control cabinet, through window opening 110H1 formed in sidewall 110H and into the low voltage secondary bay 110K of the cabinet, as shown in FIG. 10. The cable 112D can be connected to the panel 112 on the front cover, and the cables 102D, 104D can be passed through service opening(s) formed in the bottom wall 110B of the cabinet and then routed to the respective panels 102 and 104. Similarly, the low voltage wiring for the low voltage loads is passed from the main bay 110F through window 110G1 of sidewall 110G into the right low voltage secondary bay 110J, and then routed through service opening(s) formed in the bottom wall 110B of the cabinet for routing to the low voltage loads and sensors.

An aspect of this invention is the use of a controller system which is readily field wired, providing significant saving in installation labor. The board 250 can be removed from the cabinet 110 easily, without disconnecting the line voltage conductors 60B1–60B4. This is accomplished by removing the fasteners 258 which secure the board to the cabinet, removing the fasteners 251 which connect the board to the terminal block 240, and disconnecting the line voltage and low voltage connectors. This can be done in a matter of minutes, and thus facilitates servicing the system 100. If a board 250 is malfunctioning, it is a simple matter to remove it for repair or replacement in the field. Moreover, because the line voltage conductors 60B1–60B4 need not be physically disconnected, the safety hazards involved in such work are reduced.

In an exemplary embodiment, the controller system 100 includes a microprocessor 402 such as a Pic 16C65A CMOS microcomputer marketed by Microchip, which accepts information from a variety of sensors and acts on the information, thereby operating according to instructions described more fully in FIGS. 14A–14F. The invention is not limited to the use of a controller including a microcomputer or microprocessor, whose functions can instead be performed by other circuitry, including, by way of example only, an ASIC, or by discrete logic circuitry.

Figure 14A:
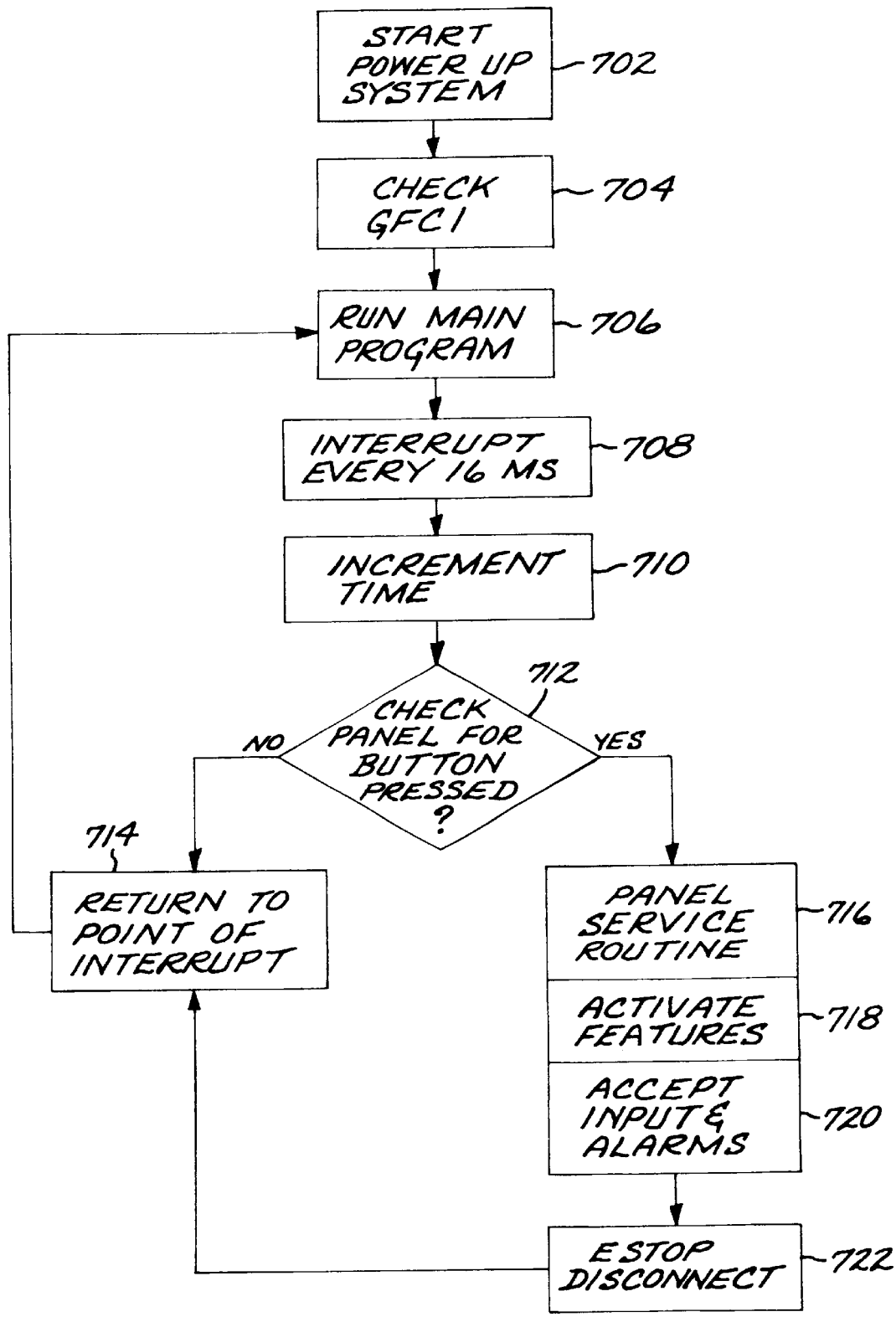
FIGS. 14A–14F are simplified flow diagrams illustrating salient program features of the controller comprising the system of FIG. 2.

An exemplary main operational routine 700 illustrating the programmed operation of the microprocessor 402 is shown in FIG. 14A. After system powerup (702), a "check GFCI" subroutine 704 is performed. This subroutine has for its purpose to electronically test whether the GFCI 62 is properly operational, and is described more fully with respect to FIGS. 14B and 15. Upon successful completion of GFCI test, the main program is run (706). The main program performs the control functions needed for running the various pool and spa functions, including running the heater and pump. The primary function of the main program is to monitor safety issues, such as over-temperature conditions. Thus, the main program will manage water temperature in the pool and spa. Other functions performed in the main program are to monitor the clock and real time to determine when to activate features, e.g. lights, heater, and the like in accordance with a programmed time schedule. The microprocessor is user-programmable to set up the schedule. U.S. Pat. Nos. 5,361,265 and 5,559,720 describe techniques for programming microprocessors in a spa environment.

The routine 700 performs an interrupt (708) of the main program every 16 milliseconds in this embodiment. As part of the interrupt routine, the system time, kept by an incremental timer, is incremented (710) by adding one to the internal stack of the counter, and the control panel buttons are checked (712) to see for activation. If none of the buttons have been pressed or otherwise activated, operation returns (714) to the main program at the point of interrupt. If any control panel switches have been activated, then the panel service subroutine 716 is entered. This panel service subroutine activates features, and accepts and inputs and alarms entered via panel switches. The panel push-button impulse, generated by the electronic panel circuitry, is several hundred milliseconds long. Since the interrupt is every cycle of the line power supply, or approximately every 16 milliseconds, the processor has ample time to detect a button push and respond accordingly. The processor loads the data represented by a button push, and loads that data into a register. This register is then accessed by the microcomputer every few milliseconds and appropriate action is taken. After completion of the panel service subroutine, the emergency disconnect routine is entered (718), and thereafter operation returns (714) to the main program to the point of interrupt.

Figure 14B:
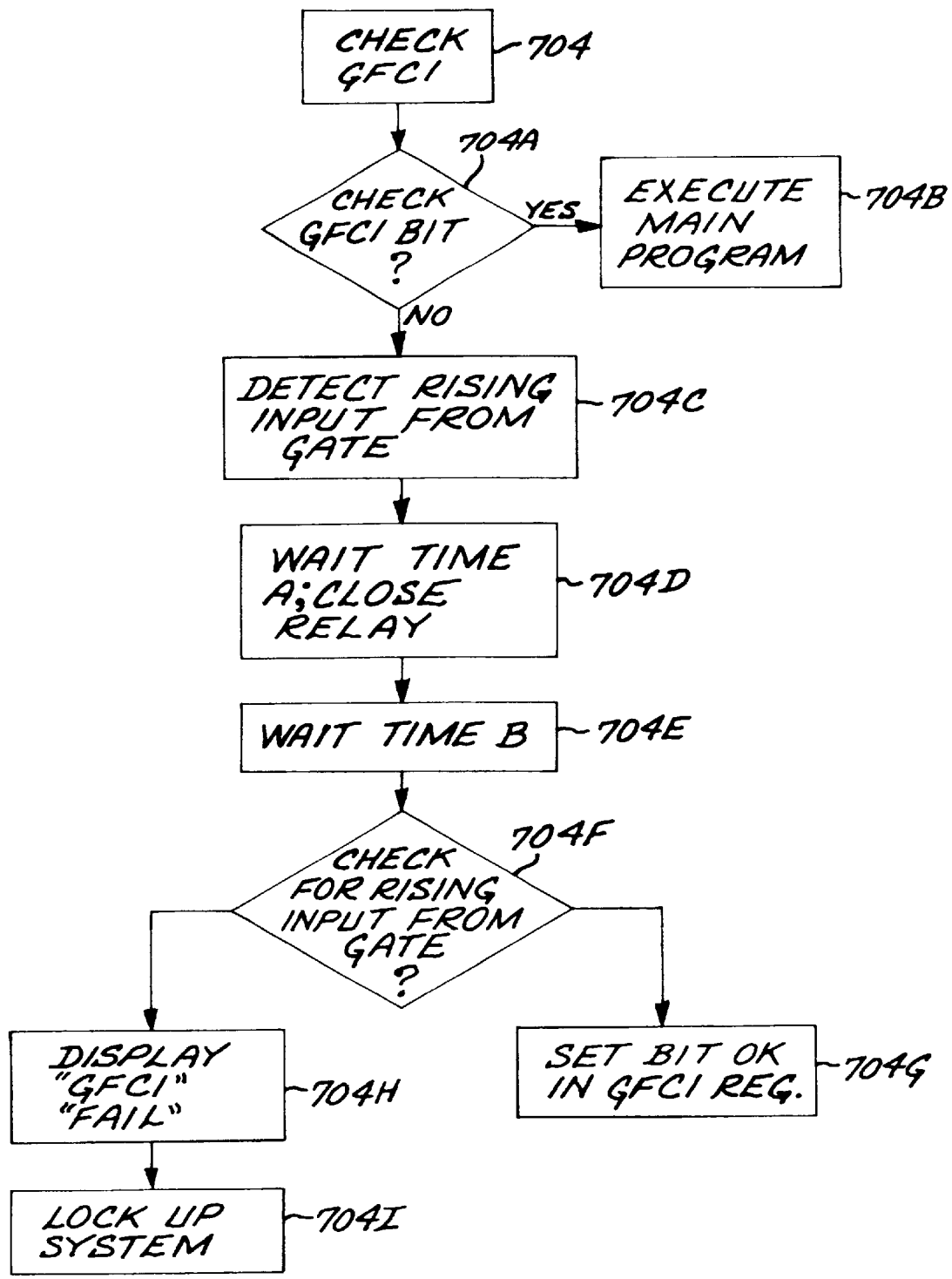
Figure 14C:
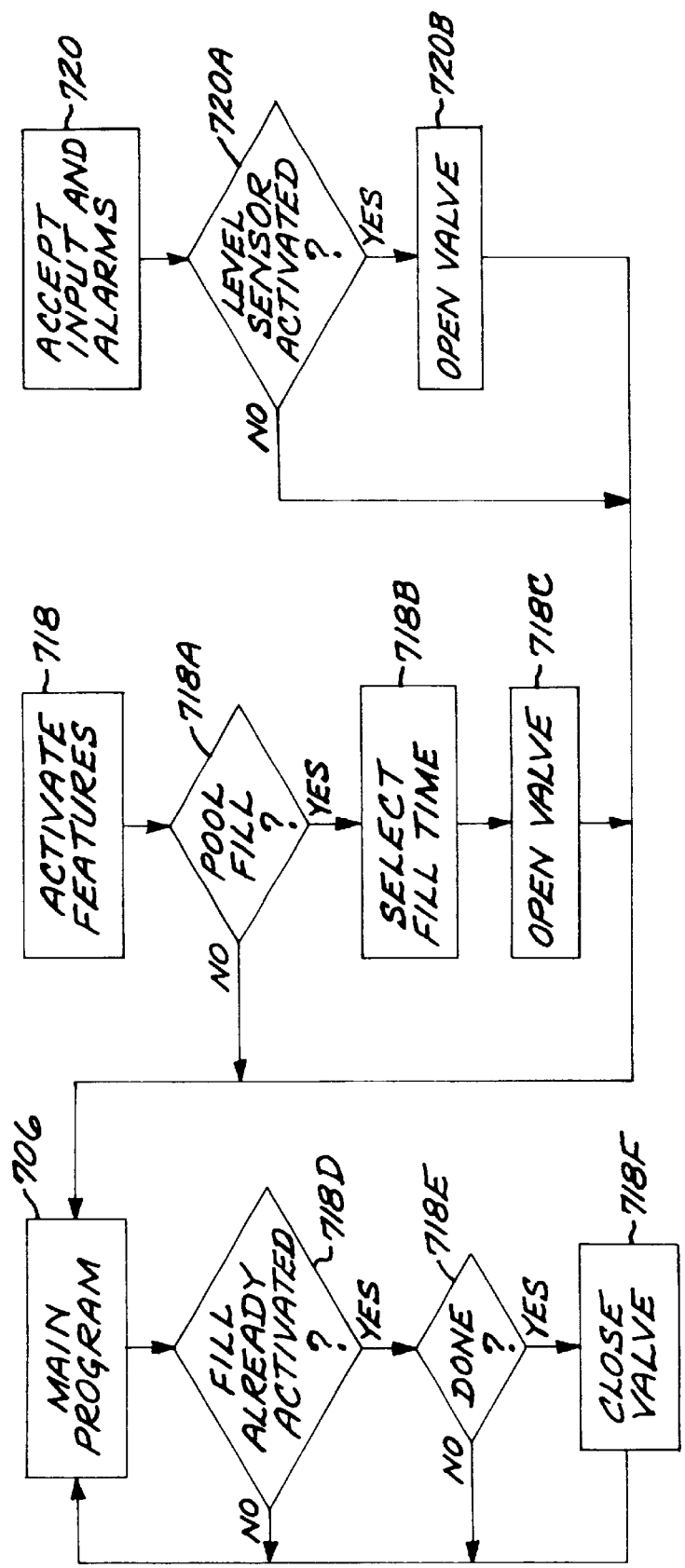
Figure 14D:
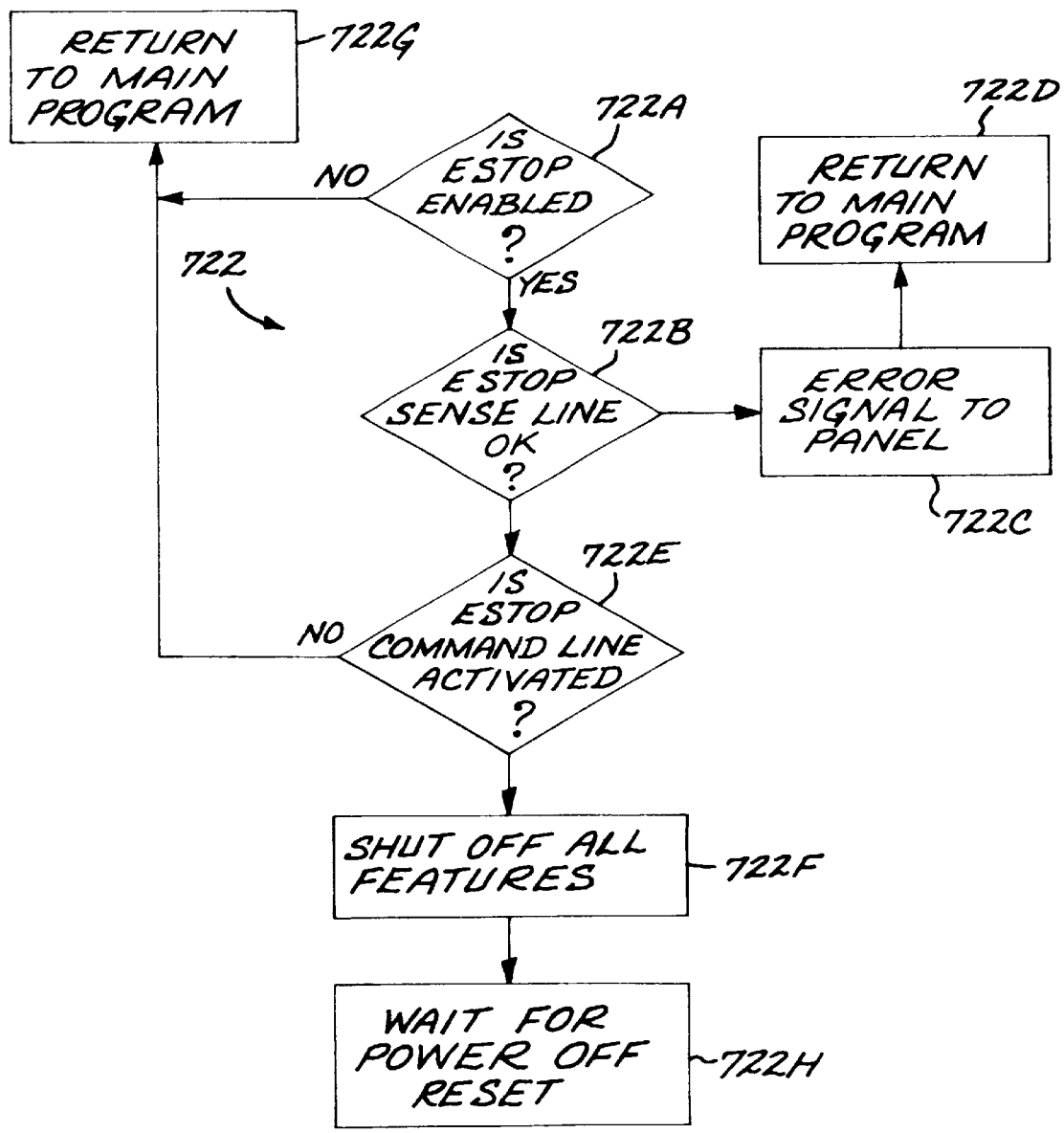
Figure 15:
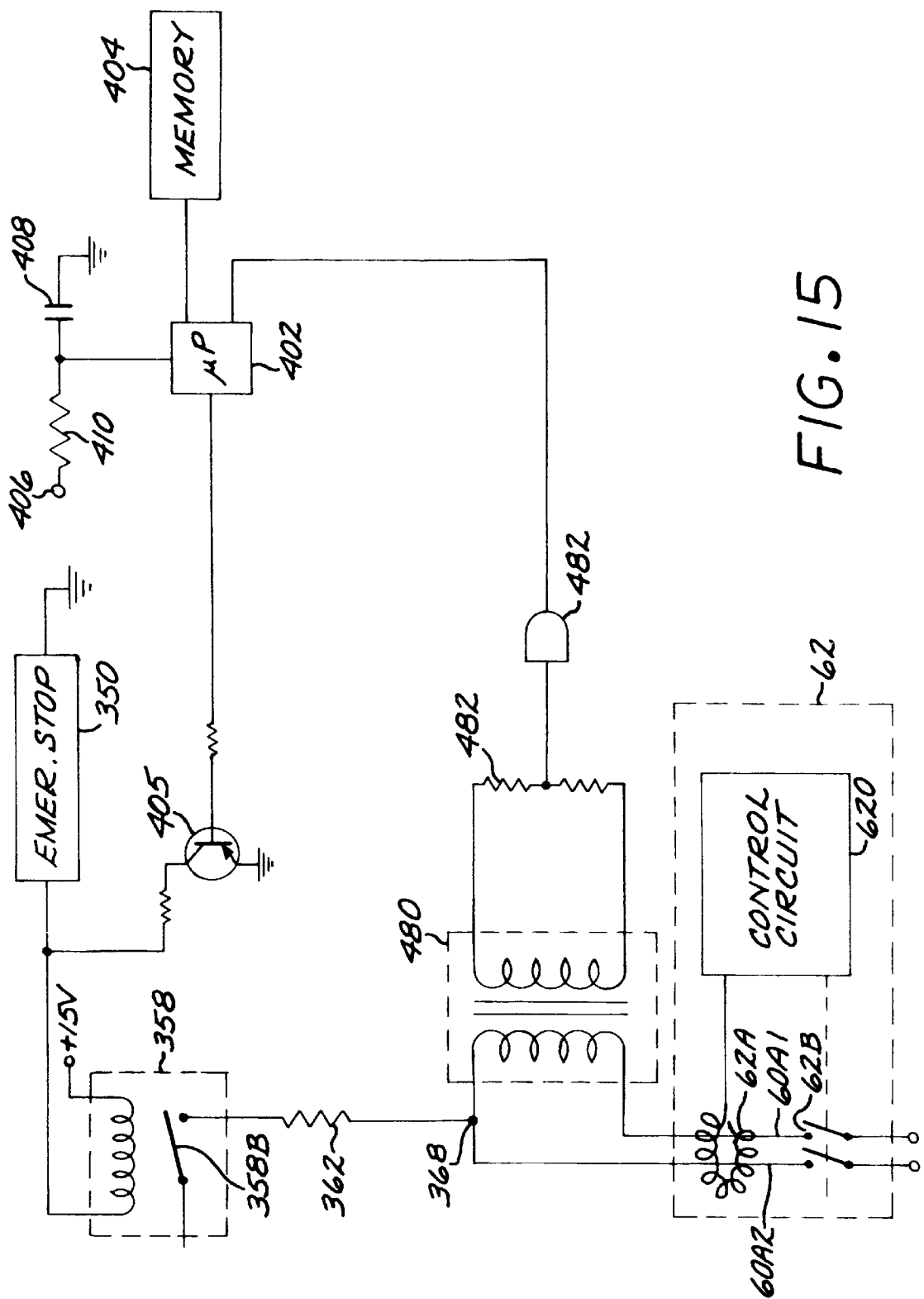
FIG. 15 is a simplified schematic diagram illustrating the GFCI test circuit comprising the system of FIG. 2.

The GFCI test routine 704 is described further with respect to FIGS. 14D and 15. According to this aspect of the invention, the system 100 will test for proper connection and operation of the GFCI 62. This is done in the exemplary embodiment by inducing a ground fault shortly after power up of the system, and then looking for GFCI interrupt within a specific short time. If this does not occur, the controller 100 will display a type of "GFCI absent" message and accept no further inputs from the control panels, preventing further operation of the system 50. If an interrupt does occur, this event will be stored in a nonvolatile memory as a flag. Then, when the system is re-powered up, the stored flag information will be read, the system will know a GFCI is installed, and the system 100 will operate normally.

Thus, when the system 100 is powered up the first time after installation, it will wait a short time, say five seconds to ten seconds, and conduct a GFCI test to determine whether the GFCI 62 is operational. FIG. 15 illustrates schematically circuit elements employed for this test. The GFCI 62 is a well known apparatus, and includes sense coil 62A, relay 62B and control circuit 62C. The sense coil 62A is coupled to conductors of the 50Amp service 60A. In the event of a current imbalance between the incoming and outgoing current in the line voltage service, the control circuit will sense this condition through coil 62A, and open the relay 62B, interrupting power. The function of a GFCI is well known in the art.

The controller 100 includes a voltage transformer circuit 480 will transforms the 120 VAC input line voltage to a 12 VAC level. This 12 VAC is applied to a voltage divider, and the sinusoidal divider voltage drives the input to gate 484, which converts the sinusoidal input signal to a square wave signal between 0 V and +5 V. The microprocessor monitors the square wave signal, and will sense nulls in the power waveform to switch the relays at zero crossings in the power waveform to minimize arcing in the relays.

An output port of the microprocessor 402 is coupled to a relay 358. One switched port of the relay is connected at node 368 to one 120 VAC wire; the other switched port is connected to earth ground. A power supply 406 provides a dc power supply voltage from the line voltage transformer to power the microprocessor. Also connected to the microprocessor is a nonvolatile random access memory (RAM), e.g. an EEPROM memory 404.

The GFCI test is performed by the microprocessor 402 providing a control signal to turn on transistor 405, closing the relay switch 358B and shorting the line voltage at node 368 to earth ground through a 10 Kohm resistor 362. This will create an imbalance in the power supply lines 60A1 and 60A2. If the GFCI 62 is present and properly connected, the GFCI relay switch 62B will be opened, interrupting power to the transformer 480. The microprocessor 402 will sense this condition, through its monitoring of the gate 482 output, and in response to lack of a square wave signal will store a flag bit in the EEPROM 404. This will occur before the microprocessor loses power. The next time the system 100 is powered up, the startup program routine will look for this bit, and if set will proceed to execute the main program. However, if the flag is not set, the GFCI test will be performed.

The GFCI 62 must open the circuit within a certain time period after a short or imbalance is detected. For example, for a Class A GFCI, the rated time period is 7 milliseconds, and for a Class B GFCI the rated time period is 20 milliseconds. Therefore, there must be a start time for the test and a finite period of time after the relay 358 is closed to indicate a successful test. Because each cycle of the 60 cycle line voltage supply is 16 milliseconds long, the microprocessor must wait a certain time period, time A, before closing relay 358. The signal input for the start of the time period A is the square wave from gate 482, connected to the transformer 480, which generates an AC signal proportional to the line voltage supply, but isolated from the line voltage supply.

The time period A can vary from 1 millisecond to 15 milliseconds in this embodiment. Time interval B is the time period before checking for another input from the gate, i.e. a rising edge or high state on the square wave signal. Time interval B can vary from 1 millisecond to several hundred milliseconds, but will generally not exceed 100 milliseconds.

When the microprocessor 402 has begun the time B countdown, it looks for one input on the gate waveform. If it continues to see rising or high inputs on the gate waveform, indicating that the GFCI relay has not opened, the microprocessor will wait the entire time B, and then branch to a lockout program. This program will set an error message to the main control display panel such as "GFCI FAIL," and stop further input or operation.

If there is a power shutdown during this wait time B, the microprocessor will write a flag bit to the memory 404, to indicate a successful test. As the power to the microprocessor is shut off, a short term power supply back supply, shown schematically as capacitor 408 and resistor 410, will give the microprocessor 402 sufficient time to finish the wait time B, and set the GFCI flag in the memory 404 before shutdown.

FIG. 14B shows the GFCI subroutine 704 in further detail. After system powerup at 702, the GFCI flag bit memory location in the memory 404 is checked (704A), and if set, operation returns to the main program (704B). If the bit is not set, then at 704C, the microprocessor monitors the gate output to detect a rising input from the gate. Once this is detected, after a wait of time interval A, the relay 358 is closed (704D). Now the microprocessor waits for time interval B (704E), and then checks for a rising input from the gate (704F). If a rising input is not detected, then the GFCI flag bit is set (704G), and the system 100 will shut down. If a rising input is detected, indicated that the power was not interrupted, then a "GFCI FAIL" message is displayed (704H), and the system is locked (704I), preventing further operation or input. Typically, all functions are disconnected or disabled, except the water pump, which is needed for freeze protection.

An aspect of the invention is to integrate with the pool controller system 100 the circuitry or logic necessary to respond to user commands to activate the fill valve 76 to dispense water into the pool from the water line. The controller is responsive to a manual control panel selection by the user to actuate the fill valve, say by actuation of panel button 102B1 (FIG. 4), and release water into the pool to replenish the water. The controller starts an internal timer, and then after a predetermined timer interval elapses, or a time desired by the user, shuts off the valve to stop filling the pool with water. This will address the problem of the pool owner manually turning on a fill valve, and then forgetting to later turn off the valve. Alternatively, a water level sensor detects a low water level condition, and automatically activates the fill valve for a predetermined time interval. As an additional optional protection against overfilling, the water level sensor can sense an overfill level, and provide a signal to the controller indicative of this condition. The controller acts on the overfill signal to close the fill valve, even though the predetermined timer interval has not elapsed.

The pool fill feature is illustrated in the flow diagram of FIG. 14C. During an interrupt (708) from the main program, the "activate features" subroutine 718 is entered. One of the features is the "pool fill" feature; of course there can be other features activated during this interrupt, not pertinent to the fill routine. If the user enters a pool fill command through one of the control panels, by activating one of the panel switches, for example, then the pool fill feature is selected (718A) If the pool fill feature is not selected, operation returns to the main program, or to another feature. At 718B, the fill time is selected. The user can enter this data through the control panel, e.g. in increments of minutes, or a default fill time can be used, e.g. 30 minutes. In the later event, operation can proceed from step 718A immediately to step 718C, to open the valve. Otherwise, the time is set, and then the valve is opened, with the microprocessor starting a timer for timing out the selected or default fill time interval. At this point, operation returns to the main program.

A function of the main program 706 is to monitor the fill activity once started. Thus, at periodic step 718D, a check will be made for the status that a fill has already been activated. If not, operation returns to the main program. If a fill operation has been started, the timer is checked at step 718E. If the fill time has not expired, operation returns to the main program. If the fill time has expired at 718E, the fill valve is closed (718F), and operation returns to the main program.

Another feature is the use of a water level sensor for detecting whether the pool water level has reached a low level, at which water should be added. Thus, during subroutine 720, for accepting sensor inputs and alarms, the water level sensor 224 is checked at 720A. If the water level is above the low level, operation returns to the main program. If the pool level is at the low level, the pool fill valve 74 is opened, and operation returns to the main program. The pool fill valve can be subsequently closed when the water level sensor probe again makes contact with water. Alternatively, the processor can be programmed to close the valve a predetermined time interval after it is opened, say one hour. Also, the overfill condition can be sensed, and this information triggers closing the fill valve even though the time interval has not yet elapsed.

Another aspect of the invention is an emergency disconnect switch for the pool/spa, implemented without the need for bringing line voltage to the emergency disconnect switch, but rather using low voltage signals and the intelligence of the spa controller 100. The emergency disconnect switch when closed will cause a grounding resistor to be connected between the earth ground line and line voltage, inducing a ground fault which will be detected by the GFCI 62, thus providing a level of redundancy.

Figure 16:
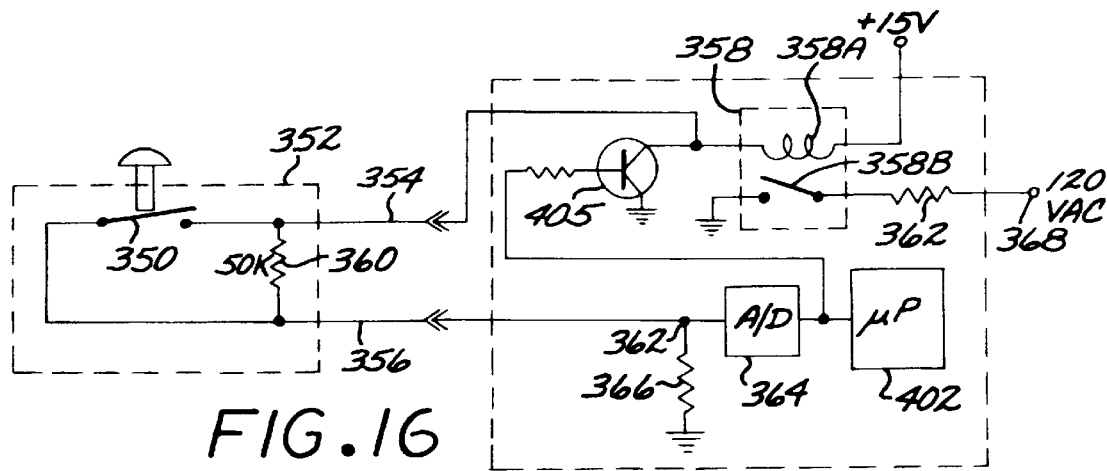
FIG. 16 is a schematic diagram of an emergency disconnect switch in accordance with an aspect of the invention.

This feature is illustrated in FIG. 16. The emergency disconnect switch 350 is on a housing 352, which is mounted near the spa, to be accessible in the event of a need to immediately shut down the pool/spa equipment powered by line voltage through the system 100. Conductor wires 354, 356 run between the circuit board 250 of the controller system 100 and respective terminals of the normally open switch 350. The wire 354 is connected to one terminal of the coil 358A of a relay 358 on the circuit board 250; the other terminal of the relay coil is connected to a 15V supply. The relay switch 358B is connected between earth ground and through a 10 Kohm resistor 362 to one phase of the line voltage service, e.g. the black 120 VAC line, at node 368. The other terminal of the switch 350 is connected to wire 356, which is connected to node 362 at the board 250. A 50 Kohm resistor is mounted in the housing 352 between the wires 354 and 356, and in parallel with the switch 350. A 10 Kohm resistor 366 is connected from node 362 to ground, forming a voltage divider with the resistor 360. An analog-to-digital converter (ADC) 364 is also connected to node 362 on the circuit board 250, and provides a digital voltage value to the system controller 402 mounted on the board 250.

The closing of the emergency stop switch 350 will close the relay switch 358B, connecting the 120VAC black line voltage at node 368 through resistor 362 to earth ground. This is a ground fault, which is detected by GFCI circuit 62, and which is tripped, interrupting line voltage service to the pool controller and power distribution system 100. Thus, all power to system 100 will be interrupted. As a redundant power disconnect feature, the voltage at the voltage divider node 362 is monitored through the ADC 364 by the controller 402 under normal operating conditions. If the switch 350 is closed, the resistor 360 is bypassed, and the voltage at node 362 read by the ADC changes. The controller 402 detects this condition, and immediately opens the relays providing line voltage to all line voltage loads. Thus, even if the GFCI 62 were to fail, and therefore not interrupt line voltage service to system 100, the controller 402 would take action to open shut down the line voltage loads.

The controller 402 can also detect that the emergency disconnect switch 350 is not properly installed. In this case node 362 will be at an open circuit voltage condition. The controller 402 monitors the voltage at node 362, and if an open condition is detected, this is recognized as an error or fault condition. The controller can then prevent operation of the system 100, prevent line voltage from being connected to the line voltage loads, or take other action needed to address the lack of proper connection of the stop switch, such as providing an error message on the control panel display.

FIG. 14D illustrates the "ESTOP disconnect" subroutine 722 (FIG. 15) in further detail, wherein the emergency stop switch 350 is monitored. At 722A, a check is made to determine whether this feature is enabled, and if not, operation returns to the main program (722G). If the feature is enabled, then the microprocessor 402 reads the voltage at node 362 through the ADC 364. If a value indicating the presence of the switch and resistor 360 is not read, an error message is displayed on the control panel (722C) and operation returns to the main program. If the microprocessor senses that the emergency switch system is installed, then at step 722E, if the voltage at node 362 indicates that the switch 350 is closed, then all line voltage loads and features are shut down (722F) and the controller 100 will wait for power off and reset. If the switch 350 is not closed, operation returns to the main program (722G).

When the pool filter becomes clogged, the filter pressure rises. As shown in FIG. 1, filter pressure sensors 208A and 208B are mounted in the filter inlet and outlet lines 9 and 10 to monitor the back pressure, i.e. the difference between the input water pressure and the output water pressure, and when it reaches a certain level, the controller causes a warning or error signal to be displayed on the control panel, such as "Back Flush the Filter" or "Clean Filter."

Another aspect of this invention is the monitoring of the natural gas supply pressure to the pool heater system. A gas pressure sensor 224 is placed in the gas line to the pool heater 78 to monitor gas pressure. The sensor includes a sending unit which provides a gas pressure signal. Pressure sensors suitable for the purpose are commercially available; one exemplary sensor is marketed by Omega Engineering Inc., Stamford, Conn. as the 30 PSI sensor device, PX182-030-GI. This signal is provided to the controller 402, which is programmed to provide an error message on the display of control panel 102 when pressure reaches a minimum threshold, and also prevents the heater from operating.

Figure 14E:
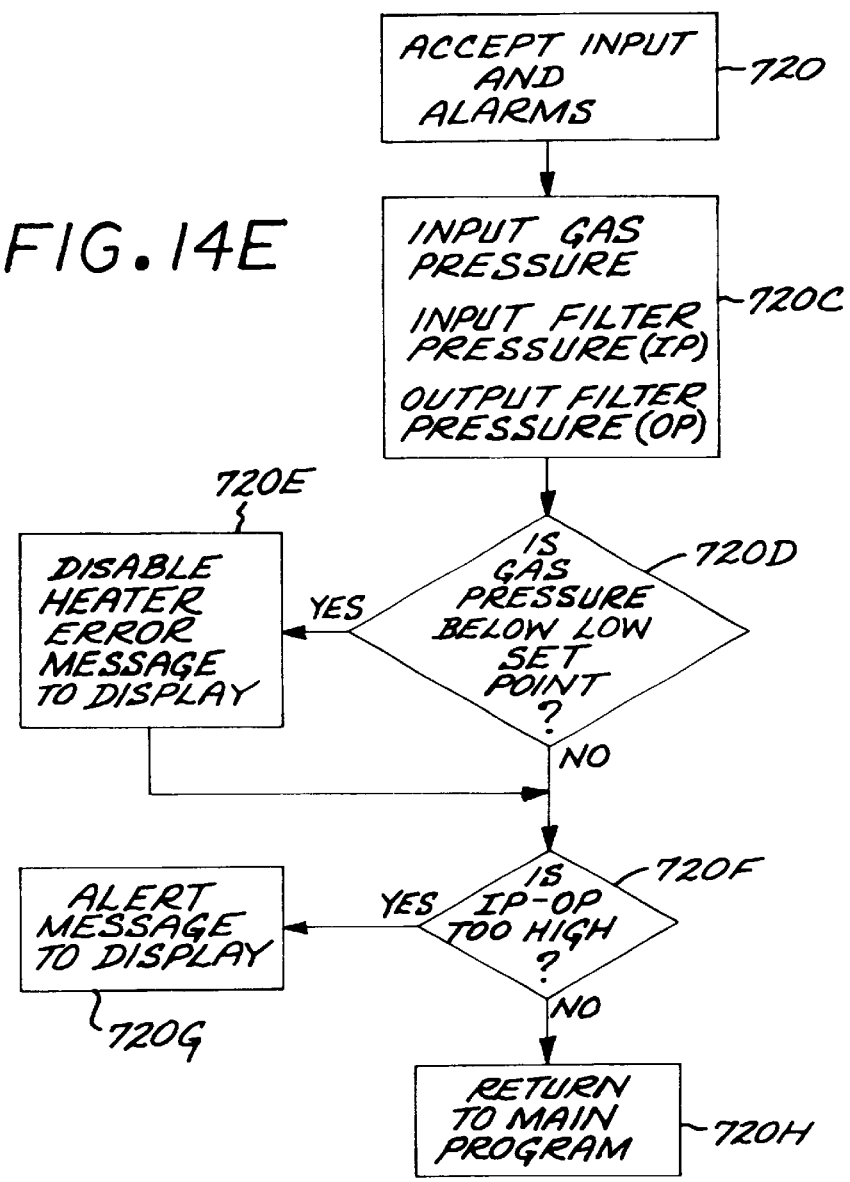

The gas pressure and backpressure monitoring features are further illustrated in the flow diagram of FIG. 14E. The subroutine 720 ("accept input and alarms") further includes step 720C, wherein the microprocessor receives as data inputs the gas pressure value, the input water pressure (IP) to the filter, and the output water pressure (OP) from the filter. At step 720D, if the gas pressure is below the predetermined low threshold value, the heater is disabled and an error message is sent to the panel display (720E). If the filter backpressure (i.e., the difference between the input pressure and the output pressure) exceeds a predetermined threshold value (720F), an alert message is sent to the panel display to indicate that the filter should be cleaned (722N).

Figure 14F:
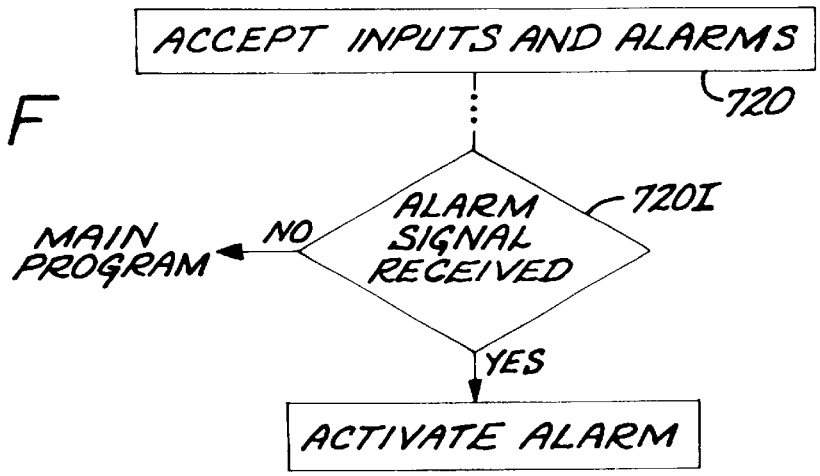

FIG. 14F illustrates additional steps which can be included in the "accept inputs and alarms" subroutine 720. Sensors 218 and 216 respectively detect the condition that the pool cover is open or the gate to the pool area is open. The sensors can be Hall effect switches, or other types of switching devices, as will be apparent to those skilled in the art. The sensor outputs are connected to the controller 402, which is programmed to interpret the outputs as potential alarm conditions, and generates an audible warning signal using alarm sound speaker or siren 96 (FIG. 6) or another warning signal such as a visible message on a panel display, indicating that the pool gate or cover is open. Thus, at step 720I, the subroutine checks to see whether an alarm signal has been input from a sensor such as the gate open sensor 218 or the pool cover alarm 224. If not, operation returns to the main program (or to other aspects of this subroutine). If an alarm has been received, then an alarm output is activated by the controller 402, which can initiate an audible and/or visible warning message.

An improvement in production is obtained by use of an in-circuit-programmable microcontroller. This microcomputer can be programmed by sending suitable signals to an appropriately configured input circuit after the microcomputer has been installed via solder connections onto the circuit board 250. This improved production technique includes the steps of (i) soldering the microcomputer into a circuit board configured for in-circuit programming; (ii) connecting the board to a programmer device using electrical leads, in accordance with the manufacturer's instructions; (iii) loading the program into the microcomputer from the programmer; (iv) power up the circuit board in accordance with normal operating procedures; and (v) verify the proper functioning of the circuit board with the microcomputer. Operation is verified in this embodiment by powering up the board and performing an operational clock, either manually or by a suitable computer test system.

Temperature sensors that are known in the art utilize a single thermistor sealed inside a case for sensing water temperature, high limit temperatures in a heater, and air temperatures. To facilitate redundancy in these critical components, two thermistors are installed inside one housing. This moderate increase in cost doubles the reliability of a very reliable technology, and removes the need for a more expensive option of dual sensor assemblies dedicated to a single temperature value.

Figure 17:
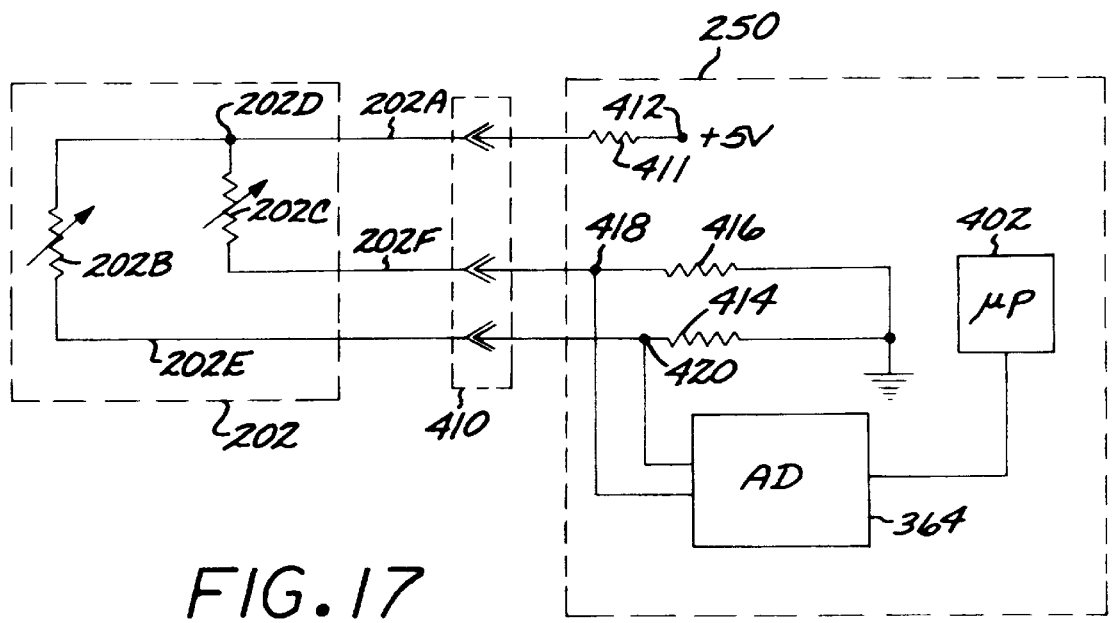
FIG. 17 is a schematic diagram of a temperature sensor in accordance with an aspect of the invention.
Figure 18:
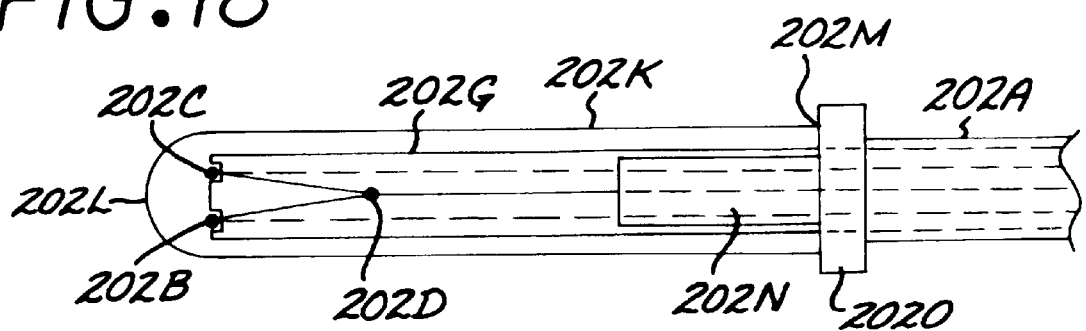
FIG. 18 is a diagrammatic view of the temperature sensor of FIG. 17.
Figure 19:
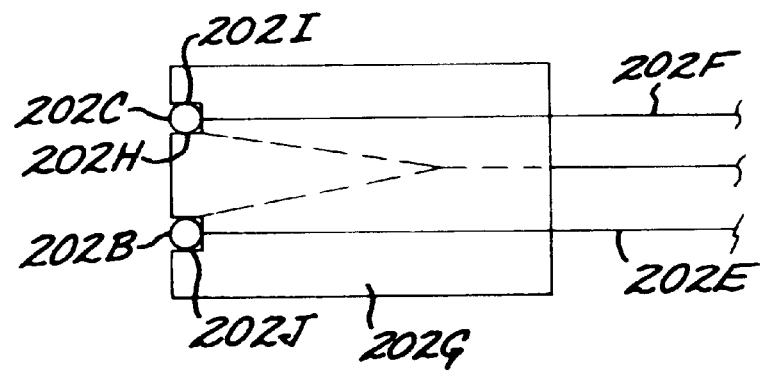
FIG. 19 is a bottom view of the circuit board comprising the temperature sensor of FIG. 17.

FIGS. 17–19 illustrate temperature sensor 202 in further detail. Temperature sensors 204 and 206 can have the same circuitry and structure as sensor 202, and so will not be described further. FIG. 17 is a circuit diagram of the sensor 202, which includes two solid state temperature sensing devices 202B, 202C, one terminal of each connected to wiring 202A at node 202D. The solid state temperature sensing devices can be implemented by various devices, including thermistors, thermocouples, temperature-sensing diodes wherein leakage currents are temperature-dependent, or constant current source circuits wherein the current is temperature-dependent. An end of the wiring 202A is connected to the controller circuit board 250 at connector 410. The wiring 202A is connected to a +5 VDC supply node 412. The second terminal of thermistor 202B is connected by wiring 202E, through the connector 412 to one terminal of resistor 414, connected to ground. The second terminal of thermistor 202C is connected by wiring 202F to resistor 416, also connected to ground. The resistors 202B and 414 thus form a voltage divider circuit, with the voltage at node 420 dependent on the variable resistance of the thermistor. Similarly, resistors 202C and 416 provide a voltage divider circuit, with the voltage at node 418 dependent on the variable resistance of the thermistor. The voltages at nodes 418 and 420 are converted to digital values by ADC 364 and monitored by the controller 402. Since the resistance values of the thermistors vary precisely with their temperatures, two temperature readings are provided by the sensor 202. The temperature values can be averaged, and in the event of anomalous readings from one or the other thermistor, the anomalous value can be discarded. This temperature sensor provides improved reliability through this redundancy.

An improved assembly technique is also used in the fabrication of the sensor 202. Referring now to FIGS. 19 and 19, the sensor includes a dielectric substrate or circuit board 202G. A distal end 202H of the substrate has two notches 202I, 202J formed therein. The respective thermistors 202B, 202C are supported in the notches of the board. FIG. 18 is a diagrammatic view showing one side of the board 202G; FIG. 19 shows the reverse side of the board.

The sensor 202 further includes a metal tubular housing 202K having a closed end 202L and an open end 202M. A collared sleeve 202N is used, in combination with the length of the sensor circuit board 202G, to precisely control the depth of insertion of the circuit board into the housing prior to potting with an epoxy. This eliminates the problem of imprecise circuit board placement, which can lead to disparities in sensed temperatures between sensor units. The sleeve 202N has an opening formed therein through which the wiring leads 202A, 202E and 202F are brought out. In this embodiment, the sleeve is a plastic molded part with a distal end which contacts the circuit board 202G, and a collar 202O is larger in diameter than the diameter of the housing 202K, thus providing a stop surface against which the open end of the housing is brought into contact during assembly. Of course, other arrangements could alternatively be employed to provide a circuit arrangement which is self-registering in insertion depth within the housing. The self-registering feature of the temperature sensor can alternatively be employed with sensors using a single sensing element, such as a single thermistor.

Figure 20A:
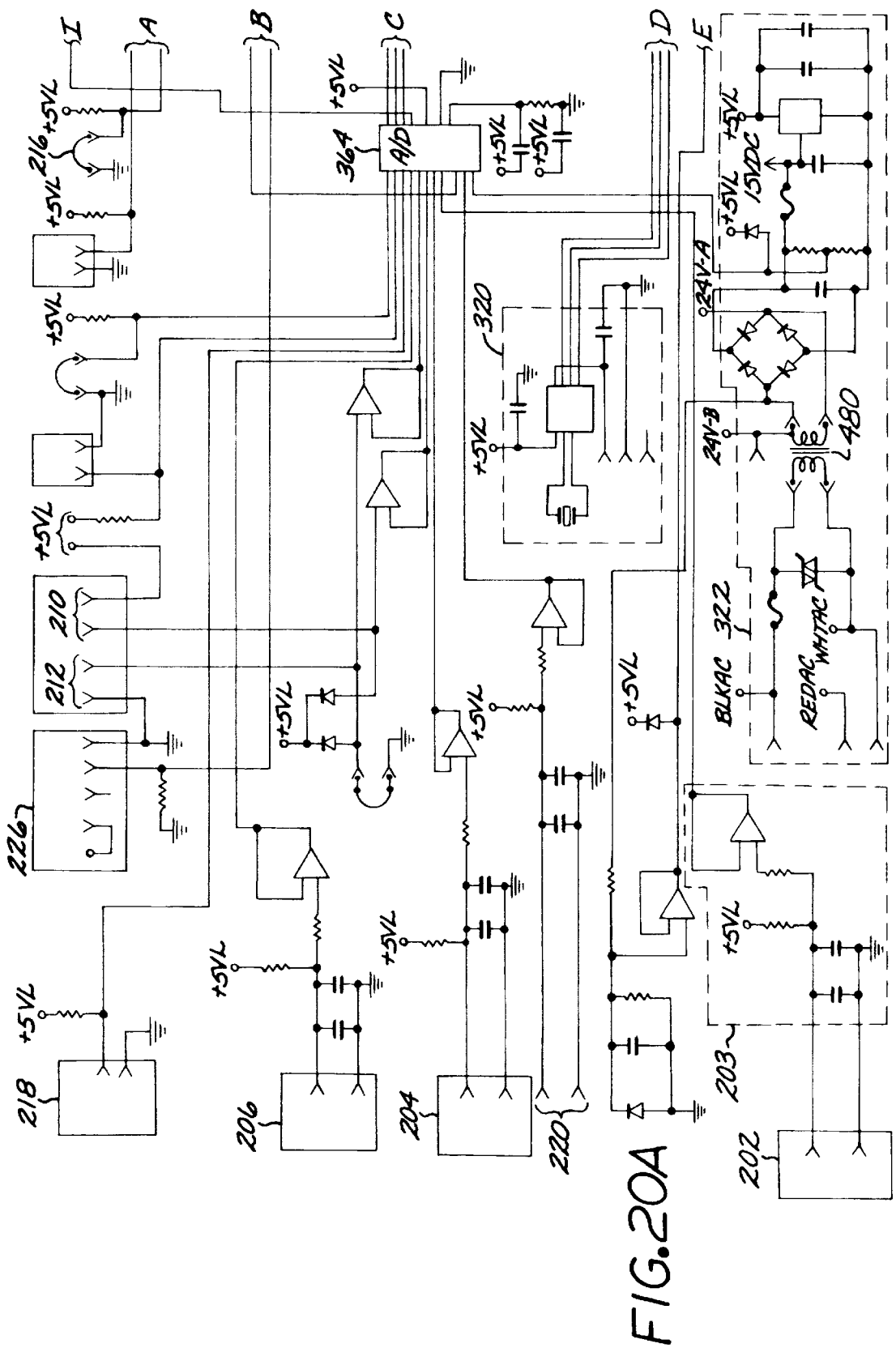
FIGS. 20A–20C are circuit schematics of an exemplary embodiment of a controller board comprising the system of FIG. 2.
Figure 20B:
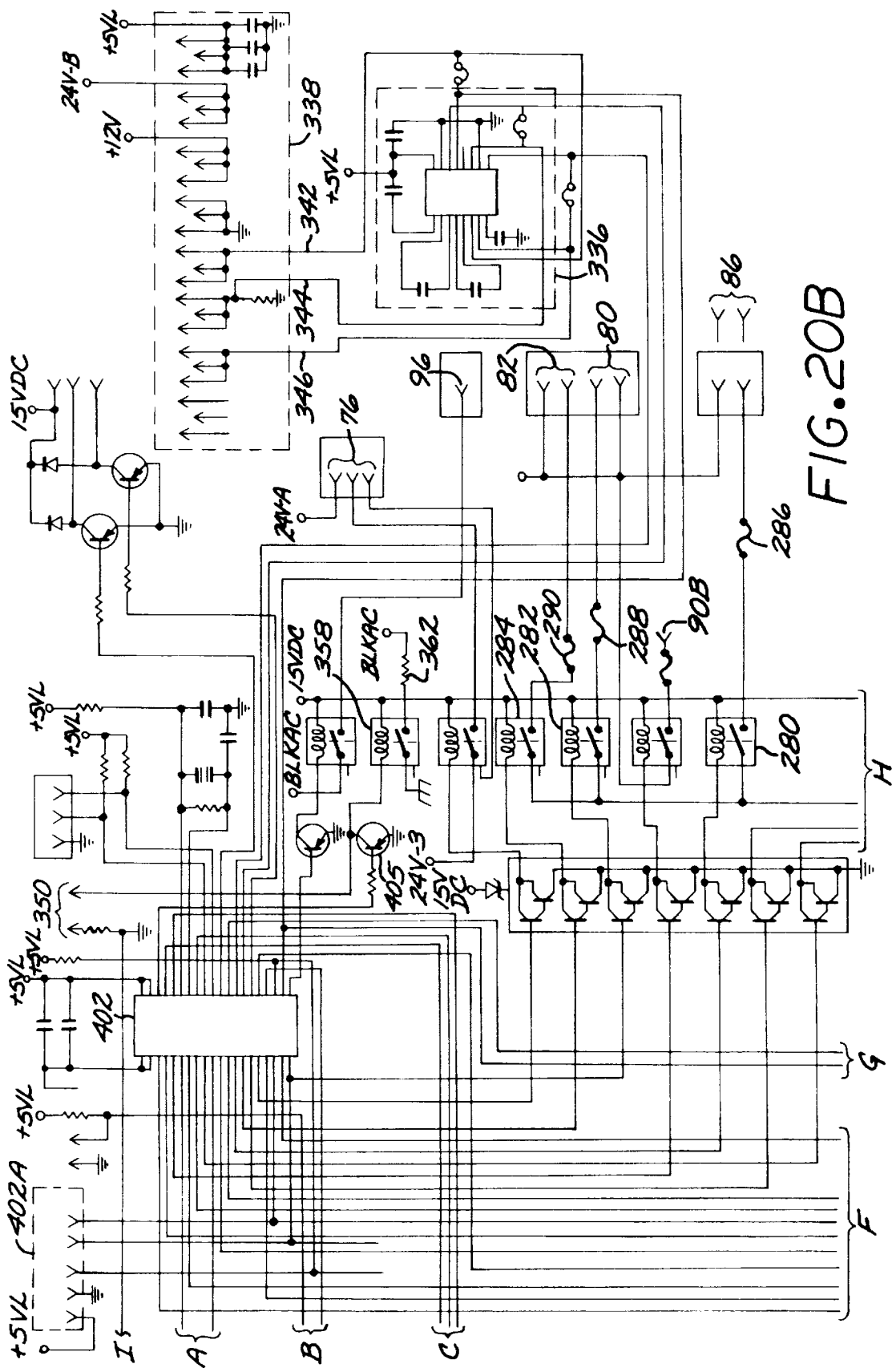
Figure 20C:
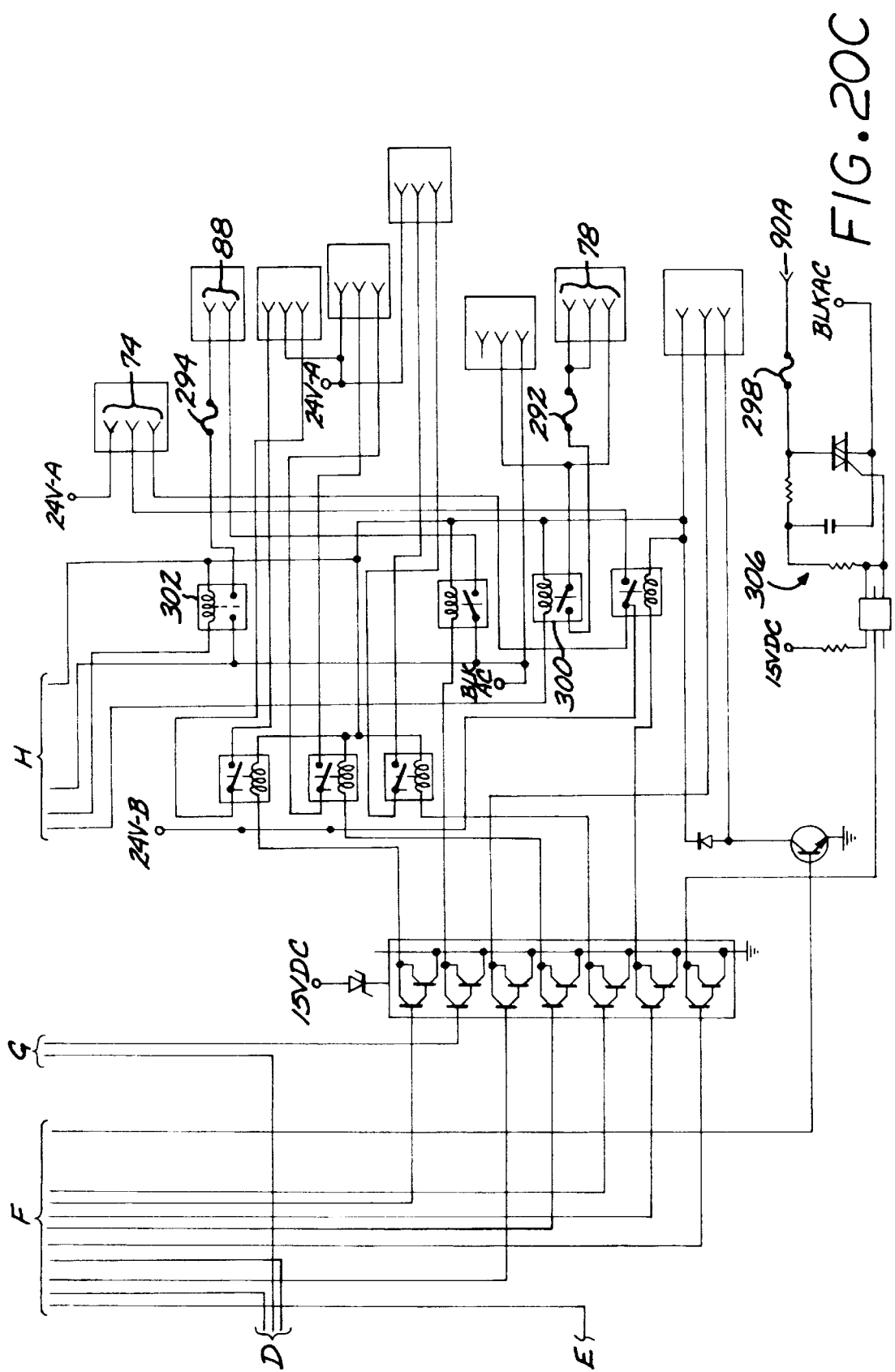

FIGS. 20A–20C illustrate an exemplary circuit schematic for the circuit board 250. Various sensor inputs to the controller are passed through signal conditioning circuitry and then to the ADC 364 (FIG. 20A). Thus, for example, air temperature sensor 202 is shown as a two wire device, e.g. with a single thermistor sensor, connected to the signal conditioning circuitry indicated as 203, although it is contemplated that an improved sensor as shown in FIGS. 17–19 will alternatively be employed. The improved sensor will utilize two multiplexed inputs to the ADC, so that each circuit can be read by the controller 402. The output of the signal conditioning circuitry is passed to the ADC 364, which can process several inputs through a multiplexing arrangement. Illustrative sensor devices 204, 206, 210, 212 are similarly connected through signal conditioning circuitry to the ADC. Other sensor devices, e.g. the gate sensor 218, may have signal levels at appropriate logic levels, and so may not require the same signal conditioning in order for the ADC to have a desired signal level to convert to digital form. Circuitry for interfacing sensor devices to a microcomputer through an ADC are well known in the microprocessor arts.

A crystal oscillator clock circuit 320 provides clock signals for the microcomputer.

The circuit board assembly 250 also includes a power supply 322 (FIG. 20A), which converts the line voltage service into 24 VAC for providing power to the water valves, and into 15 VDC, 12 VDC and 5 VDC for providing DC power needs of the controller board assembly, such as relay power and a regulated DC supply for the microcomputer 402.

The microprocessor 402 controls the line voltage loads and low voltage loads through output drivers 320 and 322, which in this exemplary embodiment are Darlington drivers which convert the logic level output signals from the microprocessor into the necessary drive signals for controlling the relays and switches which operate the line voltage loads and the low voltage loads, such as the valves. Exemplary circuitry is illustrated for operating exemplary line voltage loads, including the heater 78 (FIG. 20C) and pump 80 (FIG. 20B). Exemplary circuitry is further illustrated for operating the low voltage loads, e.g. the fill valve 76 (FIG. 20B), and valve 74 (FIG. 20C). In this embodiment, the lighting circuits 90A and 90B are controlled through triac switches. Exemplary circuitry is illustrated for operating lighting circuit 90B, by use of triac circuit 306 which is in turn driven by the driver 332 (FIG. 20C).

A set 402A of wiring connections running to programming pins of the microcomputer 402 is made available for connection to the programmer device used for in-circuit programming as described above.

The microprocessor 402 further interfaces with the control panels 102, 104 and 112 through an interface 338 and support circuit 336. The interface supplies panel power at 5 VDC, and power at 12 VDC and 24 VAC for panel lighting functions. Data output, data input and clock signals are provided on lines 342, 344 and 346, respectively. The interface provides three separate connector interfaces, one connector for each panel, so that the panels are connected to the circuit board assembly through respective detachable connector devices.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A pool controller system for distributing line voltage from a line voltage service to one or more line voltage loads and controlling operation of a pool service system, comprising:

a housing;

a controller circuit board assembly mounted within the housing, including a plurality of line voltage output terminals for connection to respective line voltage loads via line voltage wiring connections, a set of circuit board line voltage contact surfaces, a plurality of circuit conductors for providing circuit connections between the contact surfaces and respective ones of the line voltage output terminals, wherein the controller circuit board assembly routes line voltage from the circuit board line voltage contact surfaces to the output terminals;

a terminal connector structure mounted within the housing, said connector structure having a set of line voltage connectors, each line voltage connector including a pressure connector for pressure connection to a corresponding one of a set of line voltage supply conductors and a connector line voltage contact surface for contacting a corresponding board line voltage contact surface;

removable fastening structures for securing the board assembly in position within the housing such that each of the circuit board line voltage contact surfaces is in intimate electrical contact with a corresponding connector line voltage contact surface, and for permitting the board assembly to be removed for repair or replacement without disconnecting the line voltage supply conductors from said pressure connectors.

2. The system of claim 1 further including:

a plurality of sets of line voltage conductors for connections from the circuit board assembly to the respective plurality of line voltage loads; and at least one line voltage connector structure for removable connection of the plurality of sets of line voltage conductors to corresponding ones of the line voltage output terminals, wherein the sets of line voltage conductors can be readily connected and disconnected from the board assembly by use of the connector structure.

3. The system of claim 1 further comprising a voltage transformer for transforming the line voltage to low voltage levels, and wherein the board assembly includes:

a plurality of low voltage terminals for connection to low voltage wiring running to low voltage devices;

at least one low voltage connector structure for removable connection of said low voltage wiring, wherein the low voltage wiring can be readily connected and disconnected from the board assembly by use of the at least one low voltage connector structure.

4. The system of claim 1 wherein the board assembly further includes a plurality of non-resettable circuit protection devices for providing circuit protection for the line voltage loads.

5. The controller system of claim 4, wherein the circuit protection devices include fuse devices.

6. The controller system of claim 1, wherein the circuit board assembly includes a prefabricated printed wiring board including conductor traces, and the plurality of circuit conductors are defined by a set of said conductor traces.

7. The controller system of claim 1, wherein said line voltage service is a line voltage supply having a neutral conductor, a first phase conductor and a second phase conductor, and the first phase conductor and the second phase conductor are connected to corresponding ones of said set of line voltage connectors.

8. The controller system of claim 1, further comprising:
a voltage transformer mounted within the cabinet housing for transforming line voltage to low voltage; and
wherein the controller circuit board assembly further includes a plurality of low voltage switches for selectively applying low voltage to respective low voltage output wiring connections.

9. The controller system of claim 1, wherein the housing defines a main compartment and a plurality of secondary compartments, the main compartment having routed therein all line voltage wiring entering the cabinet, the secondary compartments being shielded from the main compartment and having routed therein only low voltage wiring carrying low voltage signals.

10. The controller system of claim 9, wherein the main compartment is separated from the plurality of secondary compartments by conductive inner wall structures.

11. The system of claim 1, wherein each of said circuit board line voltage contact surfaces is a planar, electrically conductive surface, and wherein each said connector line voltage contact surface is a planar, electrically conductive surface, and said removable fastening structures secure a respective planar surface of said circuit board line voltage contact surfaces and a respective planar surface of said connector line voltage contact surface together in intimate electrical and physical contact.

12. The system of claim 11, wherein said printed circuit board is a multi-layer structure having a top surface and a bottom surface, and a first set of circuit traces formed on said top surface, a second set of circuit traces formed on said bottom surface and a third set of circuit traces formed in a buried intermediate layer of the printed circuit board, and wherein said plurality of circuit conductors comprise said first, second and third sets of circuit traces.

13. The system of claim 12, wherein said circuit board contact surfaces are formed on said bottom surface of said printed circuit board.

14. The system of claim 13, wherein traces of said third set are electrically connected to respective traces of said first and second sets by conductive vias, and said line voltage output terminals are on said top surface of said printed circuit board.

15. The system of claim 1, wherein said removable fastening structures secure a corresponding circuit board line voltage contact surface in pressure contact with said connector line voltage contact surface.

16. The system of claim 1, wherein said pressure connector includes a threaded device for capturing said corresponding one of the set of line voltage supply conductors by a pressure connection.

17. The system of claim 16, wherein the pressure connector includes a frame having a threaded opening into which the threaded device is advanced to secure the corresponding one of the set of line voltage supply conductors.

18. The system of claim 1, wherein said terminal connector structure includes a terminal block body fabricated of an electrically insulating material and secured to said housing.

19. The system of claim 18, wherein said terminal connector structure is secured to a surface of said housing, and said pressure connector is disposed at a first height relative to said surface, and said connector line voltage contact surface is disposed at a second height relative to said surface, wherein said second height is greater than said first height.

20. A method for installing a pool controller system in a pool service system including one or more line voltage loads, comprising:
providing a pool controller circuit board assembly, the assembly including a plurality of line voltage output terminals for connection to respective line voltage loads via line, voltage wiring connections, a set of circuit board line voltage contact surfaces, a plurality of circuit conductors for providing circuit connections between the contact surfaces and respective ones of the line voltage output terminals, wherein the controller circuit board assembly routes line voltage from the circuit board line voltage contact surfaces to the output terminals;
providing a terminal connector structure, said connector structure having a set of line voltage connectors, each line voltage connector including a pressure connector for pressure connection to a corresponding line voltage service conductor and a connector line voltage contact surface for contacting a board line voltage contact surface;
mounting the terminal connector structure within a housing;
connecting the set of line voltage service conductors to the terminal connector structure with the set of line voltage connectors;
securing the board assembly in position within the housing with removable fastening structures such that each of the circuit board line voltage contact surfaces is in intimate electrical contact with a corresponding connector line voltage contact surfaces.

21. The method of claim 20 further including:
providing a plurality of sets of line voltage conductors for connections from the circuit board assembly to the respective plurality of line voltage loads;
connecting the plurality of sets of line voltage conductors to corresponding ones of the line voltage output terminals by at least one line voltage connector structure, wherein the sets of line voltage conductors can be readily disconnected from the board assembly by use of the connector structure.

22. The method of claim 20 wherein the board assembly includes a plurality of low voltage terminals for connection to low voltage wiring running to low voltage devices, the method further comprising:
connecting the low voltage terminals to the low voltage wiring using at least one low voltage connector structure for removable connection of said low voltage wiring, wherein the low voltage wiring can be readily connected and disconnected from the board assembly by use of the low voltage connector structure.

23. The method of claim 20, wherein the step of connecting the set of line voltage service conductors to the terminal connector structure includes, for each of the set of line voltage connectors;
tightening a threaded device to achieve pressure contact with a respective line voltage service conductor.

24. A pool controller system for distributing line voltage from a line voltage service to one or more line voltage loads and controlling operation of a pool service system, comprising:
a housing, comprising a main compartment and a plurality of secondary compartments;

a controller circuit board assembly mounted within the main compartment of the housing, including an electronic controller, a plurality of line voltage output terminals for connection to respective line voltage loads via line voltage wiring connections, a plurality of low voltage terminals for connection to respective low voltage devices, a set of circuit board line voltage contact surfaces, a plurality of circuit conductors for providing circuit connections between the contact surfaces and respective ones of the line voltage output terminals, wherein the controller circuit board assembly routes line voltage from the circuit board line voltage contact surfaces to the output terminals, and routes low voltage signals between low voltage circuitry on the circuit board, the controller and the low voltage terminals;

a plurality of line voltage supply conductors passed into the main compartment of the housing from a line voltage supply source;

a plurality of sets of line voltage load conductors passed into the main compartment of the housing from said plurality of line voltage loads and connected to the circuit board assembly;

a plurality of sets of low voltage conductors connected to respective low voltage devices, the sets of low voltage connected routed from respective ones of the secondary compartments into the main compartment for connection to the circuit board assembly;

wherein no conductors carrying line voltage are routed into any of the plurality of secondary compartments.

25. The system of claim 24 wherein:

the line voltage supply is a 240 VAC line voltage supply;

at least one of said line voltage loads is a 240 VAC load; and at least one of the line voltage loads is a 120 VAC load.

26. A pool controller system for distributing line voltage from a line voltage service to one or more line voltage loads and controlling operation of a pool service system, comprising:

a housing;

a controller circuit board assembly mounted within the housing, including a printed circuit board, a plurality of line voltage output terminals defined on said printed circuit board for connection to respective line voltage loads via line voltage wiring connections, a set of circuit board line voltage contact surfaces defined on said printed circuit board, a plurality of circuit conductors integrally formed with said printed circuit board for providing circuit connections between the contact surfaces and respective ones of the line voltage output terminals, wherein said printed circuit board routes line voltage from the circuit board line voltage contact surfaces to the output terminals;

a terminal connector structure mounted within the housing, said connector structure having a set of line voltage connectors, each line voltage connector including a respective pressure connector for pressure connection to a corresponding one of a set of line voltage supply conductors and a respective connector line voltage contact surface for contacting a corresponding board line voltage contact surface;

removable fastening structures for securing the printed circuit board in position relative to said terminal connector structure within the housing such that each of the circuit board line voltage contact surfaces on said printed circuit board is in intimate electrical contact with a corresponding connector line voltage contact surface of the terminal connector structure, and for permitting the board assembly to be removed for repair or replacement without disconnecting the line voltage supply conductors from said pressure connectors.

27. The system of claim 26, wherein each of said circuit board line voltage contact surfaces is a planar, electrically conductive surface, and wherein each said connector line voltage contact surface is a planar, electrically conductive surface, and said removable fastening structures secure a respective planar surface of said circuit board line voltage contact surfaces and a respective planar surface of said connector line voltage contact surface together in intimate electrical and physical contact.

28. The system of claim 26, wherein said pressure connector includes a threaded device for capturing said corresponding one of the set of line voltage supply conductors by a pressure connection.

* * * * *